United States Patent
Parkinson et al.

(10) Patent No.: US 10,438,657 B2
(45) Date of Patent: Oct. 8, 2019

(54) RESISTANCE AND GATE CONTROL IN DECODER CIRCUITS FOR READ AND WRITE OPTIMIZATION

(71) Applicant: SanDisk Technologies LLC, Plano, TX (US)

(72) Inventors: Ward Parkinson, Boise, ID (US); Thomas Michael Trent, Tucson, AZ (US); James Edwin O'Toole, Boise, ID (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/908,175

(22) Filed: Feb. 28, 2018

(65) Prior Publication Data

US 2019/0267082 A1 Aug. 29, 2019

(51) Int. Cl.
*G11C 11/00* (2006.01)
*G11C 13/00* (2006.01)

(52) U.S. Cl.
CPC ........ *G11C 13/0009* (2013.01); *G11C 13/004* (2013.01); *G11C 13/0069* (2013.01)

(58) Field of Classification Search
CPC .............. G11C 13/0009; G11C 13/004; G11C 13/0069
USPC ......................................................... 365/148
See application file for complete search history.

(56) References Cited

U.S. PATENT DOCUMENTS

| | | | |
|---|---|---|---|
| 7,589,343 B2 | 9/2009 | Lowrey | |
| 8,098,512 B2 | 1/2012 | Parkinson et al. | |
| 8,908,413 B2 | 12/2014 | Lowrey et al. | |
| 9,293,202 B2 | 3/2016 | Castro | |
| 9,613,698 B2 | 4/2017 | Mantegazza et al. | |
| 9,704,588 B1 * | 7/2017 | Ray | G11C 16/26 |
| 2012/0300532 A1 | 11/2012 | Yamazaki et al. | |
| 2013/0003440 A1 | 1/2013 | Scheuerlein | |
| 2014/0003128 A1 | 1/2014 | Sakamoto et al. | |
| 2016/0133319 A1 | 5/2016 | Fantini et al. | |
| 2016/0180928 A1 | 6/2016 | Kim | |

FOREIGN PATENT DOCUMENTS

WO WO 2016/160146 10/2016

OTHER PUBLICATIONS

International Search Report and Written Opinion for corresponding International application No. PCT/US2018/063017 dated Mar. 22, 2019.

* cited by examiner

*Primary Examiner* — Vu A Le
(74) *Attorney, Agent, or Firm* — Foley & Lardner LLP

(57) ABSTRACT

In a memory system, variable resistance circuits, such as transistor circuits, in the word line and bit line decoders are set during bias line set times and/or prior to turn-on times of read operations to increased resistance levels. The variable resistance circuits are kept at the increased resistance levels during an initial turn-on time period during which a selected memory cell may conducts a current spike. The increased resistance levels of the variable resistance circuit may operate to reduce or limit the width of the current spike. In response to the initial turn-on time period ending, the variable resistance circuits are set back to low resistance levels to facilitate subsequent sense results detection events and program operations.

22 Claims, 8 Drawing Sheets

RESISTANCE AND GATE CONTROL IN DECODER CIRCUITS FOR READ AND WRITE OPTIMIZATION

BACKGROUND

In some storage devices, such as those employing phase change memory, when reading data from a memory cell in a given state during a read operation, the memory cell conducts a current spike or other current waveform that resembles a current waveform of memory cell current used to program the memory cell in the other state. Consequently, the current spike conducted during the read operation can undesirably change the logic value of the data being stored in the memory cell. Such an event may be referred to as a read disturb or a false write. In order to avoid or minimize the likelihood of occurrence of such undesirable events, ways to reduce the similarity between memory cell current that a memory cell conducts during a read operation and memory cell current that the memory cell conducts during a write operation may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Figure 1A:
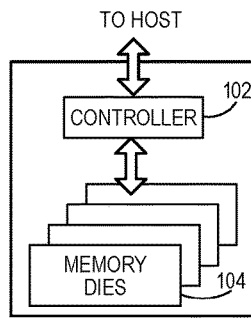
FIG. 1A is a block diagram of an example memory system.

By way of introduction, the below embodiments relate to apparatuses, devices, systems, circuits and methods for controlling resistance levels in select paths and/or gate voltages applied to transistor circuits in the select paths on a memory die during read and write operations. In one embodiment, a circuit includes a memory array that includes a plurality of memory cells, and a path configured to supply a voltage to bias a memory cell of the plurality of memory cells. The path includes a variable resistance circuit configured to: set an associated resistance to a high resistance level in advance of the memory cell turning on; and adjust the associated resistance from the high resistance level to a low resistance level in response to an end time of an initial turn-on time period.

In some embodiments, the variable resistance circuit includes a transistor configured to: receive an input voltage, and set the associated resistance to the high resistance level in response to receipt of the input voltage.

In some embodiments, the transistor is configured to adjust the associated resistance from the high resistance level to the low resistance level in response to a change in voltage level of the input voltage.

In some embodiments, the transistor is configured to set the associated resistance to the high resistance level in response to receipt of the input voltage at an intermediate voltage level.

In some embodiments, the transistor is configured to set the associated resistance to the high resistance level in response to receipt of the input voltage at a minimum voltage level.

In some embodiments, a word line decoder includes the transistor.

In some embodiments, a bit line decoder includes the transistor.

In some embodiments, a second path configured to supply a second voltage to bias the memory cell includes: a second variable resistance circuit configured to set a second associated resistance to a second high resistance level in advance of the memory cell turning on; and adjust the second associated resistance from the second high resistance level to a second low resistance level in response to the end time of the initial turn-on time period.

In some embodiments, the variable resistance circuit is configured to set the associated resistance to the high resistance level prior to a word line select period of a read operation to read data from the memory cell.

In some embodiments, the variable resistance circuit includes a pair of transistors connected in parallel, wherein one of the transistors of the pair is configured to turn off to set the associated resistance to the high resistance level, and wherein both transistors of the pair are configured to turn on to adjust the associated resistance from the high resistance level to the low resistance level.

In another embodiment, a circuit includes: a memory array including a plurality of memory cells, a voltage generator configured to generate a voltage during a read operation to read data from a memory cell of the plurality of memory cells, a transistor circuit, and a bias circuit. The transistor circuit is configured to receive the voltage and pass the voltage to a bias line coupled to the memory cell. The bias circuit is configured to: bias the transistor circuit according to a first bias setting during a bias line set period prior to a turn-on time at which the memory cell conducts a spike portion of a memory cell current, and switch to biasing the transistor circuit according to a second bias setting following the spike portion and before a sense result detection time of the sense operation.

In some embodiments, the transistor circuit includes a p-channel metal-oxide-semiconductor field-effect transistor (PMOS transistor), and wherein the bias circuit is configured to switch to biasing the PMOS transistor according to the second bias setting by decreasing a gate voltage applied to the PMOS transistor from a first voltage level to a second voltage level.

In some embodiments, the first voltage level includes an intermediate voltage level.

In some embodiments, the PMOS transistor includes one of a plurality of transistors of a word line decoder.

In some embodiments, the transistor circuit includes an n-channel metal-oxide-semiconductor field-effect transistor (NMOS transistor), and the bias circuit is configured to switch to biasing the NMOS transistor according to the second bias setting by increasing a gate voltage applied to the NMOS transistor from a first voltage level to a second voltage level.

In some embodiments, the NMOS transistor includes one of a plurality of transistors of a word line decoder.

In another embodiment, a system includes: a memory array including a plurality of memory cells, a word line coupled to a memory cell of the plurality of memory cells, a bit line coupled to the memory cell, a word line decoder, a bit line decoder, and a decoder controller. The memory cell is configured to conduct a spike portion of a memory cell current when the memory cell turns on during the sense operation. The word line decoder is configured to set a word line voltage on the word line. The bit line decoder is configured to set a bit line voltage on the bit line. The decoder controller is configured to: prior to occurrence of the spike portion, set a first effective gate-to-source voltage of a first transistor circuit in the word line decoder and a second effective gate-to-source voltage of a second transistor circuit in the bit line decoder to reduced voltage levels, where the reduced voltage levels are configured to reduce a width of the spike portion. The addition, the decoder controller is configured to, after occurrence of a peak of the spike portion, increase the first effective gate-to-source voltage and the second effective gate-to-source voltage from the respective reduced voltage levels to respective increased voltage levels configured for a subsequent event associated with the memory cell.

In some embodiments, the decoder controller is configured to increase a gate voltage to increase the second effective gate-to-source voltage of the second transistor circuit.

In some embodiments, the decoder controller is configured to decrease a gate voltage to increase the first effective gate-to-source voltage of the first transistor circuit.

In some embodiments, the respective reduce voltage levels each correspond to an associated intermediate voltage level.

In another embodiment, a method includes: supplying, with a path, a voltage to a bias line coupled to a memory cell; biasing, with a decoder controller, a transistor of the path with a gate voltage at a first gate voltage level prior to the memory cell turning on; and in response to identifying an end of an initial turn on time period, biasing, with the decoder controller, the transistor with the gate voltage at a second gate voltage level that increases a gate-to-source voltage of the transistor.

In another embodiment, a circuit includes: means for supplying a voltage to bias a memory cell during a read operation to read data from the memory cell; means for setting a resistance to a high resistance level prior to a turn-on time of the read operation; and means for changing the resistance to a low resistance level in response to an end of an initial turn-on time period of the read operation.

Other embodiments are possible, and each of the embodiments can be used alone or together in combination. Accordingly, various embodiments will now be described with reference to the attached drawings.

The following embodiments describe apparatuses, devices, systems, circuits, and methods for controlling resistances in select paths and/or gate voltages applied to transistor circuits in the select paths on a memory die during read and write operations. The actions performed to control the resistances and/or gate voltages may minimize the width of current spikes conducted during read operations, and in turn minimize the likelihood of false writes from occurring during the read operations. Before turning to these and other embodiments, the following paragraphs provide a discussion of exemplary memory systems and storage devices that can be used with these embodiments. Of course, these are just examples, and other suitable types of memory systems and/or storage devices can be used.

FIG. 1A is a block diagram illustrating a memory system 100. The memory system 100 may include a controller 102 and memory that may be made up of one or more memory dies 104. As used herein, the term die refers to the set of memory cells, and associated circuitry for managing the physical operation of those memory cells, that are formed on a single semiconductor substrate. The controller 102 may interface with a host system and transmit command sequences for read, program, and erase operations to the non-memory die(s) 104. In some embodiments, the controller 102 may be located on the memory die 104. In other embodiments, the controller 102 may be on its own and connect to a control one or more memory die or chip as a die separate from the memory dies 104.

The controller 102 can take the form of processing circuitry, a microprocessor or processor, and a computer-readable medium that stores computer-readable program code (e.g., software or firmware) executable by the (micro) processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, the controller 102 is a device that manages data stored in the memory die(s) and communicates with a host, such as a computer or electronic device. The controller 102 can have various functionality in addition to the specific functionality described herein. For example, the controller 102 can format the memory dies 104 to ensure that they are operating properly, map out bad memory cells, and allocate spare cells to be substituted for future failed cells. Some part of the spare cells can be used to hold firmware to operate the controller 102 and implement other features. In operation, when a host needs to read data from or write data to the memory die(s) 104, the host will communicate with the controller 102. If the host provides a logical address to which data is to be read/written, the controller 102 can convert the logical address received from the host to a physical address in the memory die(s) 104. (Alternatively, the host can provide the physical address). The controller 102 can also perform various memory management functions, such as, but not limited to, wear leveling (distributing writes to avoid wearing out specific memory areas (e.g., blocks of memory) that would otherwise be repeatedly written to) and garbage collection (after a memory area (e.g., a block) is full, moving only the valid portions (e.g., pages) of data to a new memory area (e.g., a new block), so the initial memory area can be erased and reused).

The interface between the controller 102 and the non-volatile memory die(s) 104 may be any suitable interface, such as flash interface, including those configured for Toggle Mode 200, 400, 800, 1000 or higher, or double data rate (DDR), non-limiting examples of which include low power DDR (LPDDR) or DDR1, DDR2, DDR3, DDR4, or subsequent variations, including but not limited to those adopted by JEDEC. For some example embodiments, the memory system 100 may be a card based system, such as a secure digital (SD) or a micro secure digital (micro-SD) card. In alternate example embodiments, the memory system 100 may be part of an embedded memory system.

In the example illustrated in FIG. 1A, the memory system 100 is shown as including a single channel between the controller 102 and the memory die(s) 104. However, the subject matter described herein is not limited to memory systems having a single memory channel. For example, in some memory systems, 2, 4, 8 or more channels may exist between the controller 102 and the memory die(s) 104, depending on controller capabilities. In any of the embodiments described herein, more than a single channel may exist between the controller and the memory die(s) 104, even if a single channel is shown in the drawings.

Figure 1B:
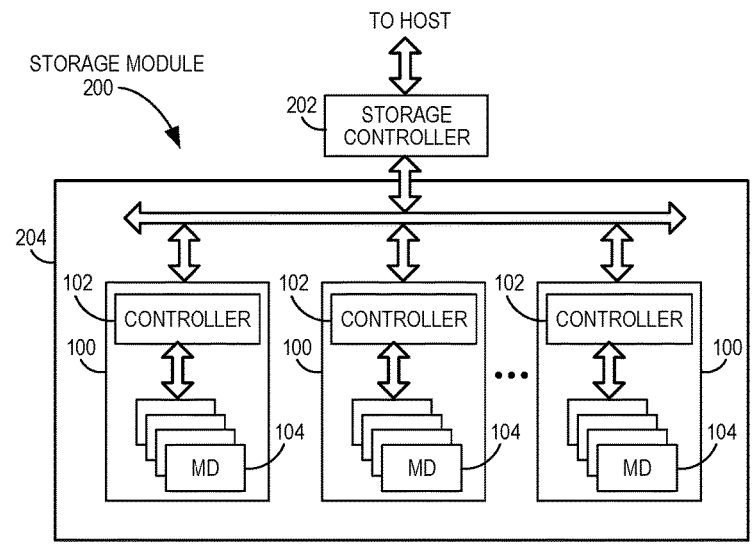
FIG. 1B is a block diagram of a storage module that includes a plurality of memory systems.

FIG. 1B illustrates a storage module 200 that includes a plurality of memory systems 100. As such, the storage module 200 may include a storage controller 202 that interfaces with a host and with a storage system 204, which includes a plurality of memory systems 100. The interface between the storage controller 202 and the memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage module 200, in one embodiment, may be a solid state drive (SSD), such as found in portable computing devices, such as laptop computers and tablet computers, and mobile phones.

Figure 1C:
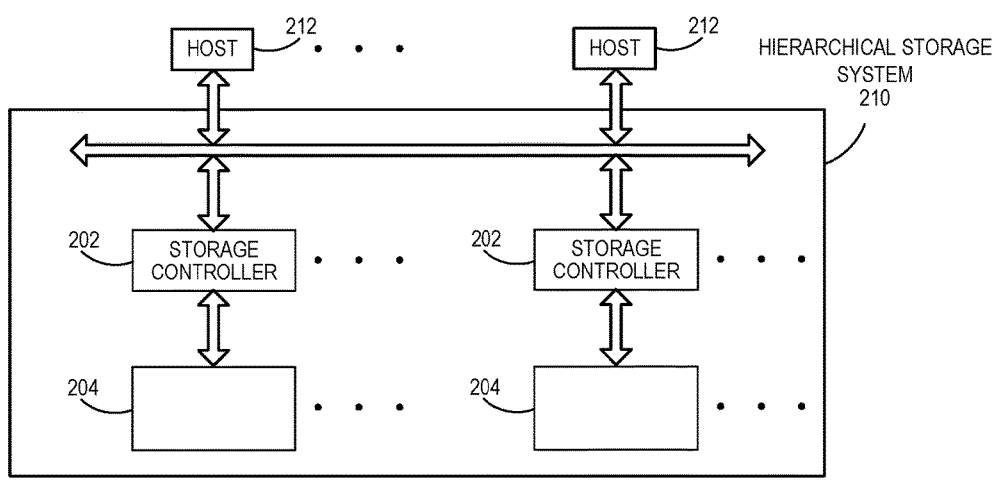
FIG. 1C is a block diagram of a hierarchical storage system.

FIG. 1C is a block diagram illustrating a hierarchical storage system 210. The hierarchical storage system 210 may include a plurality of storage controllers 202, each of which controls a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, DDR4, LPDDR4, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
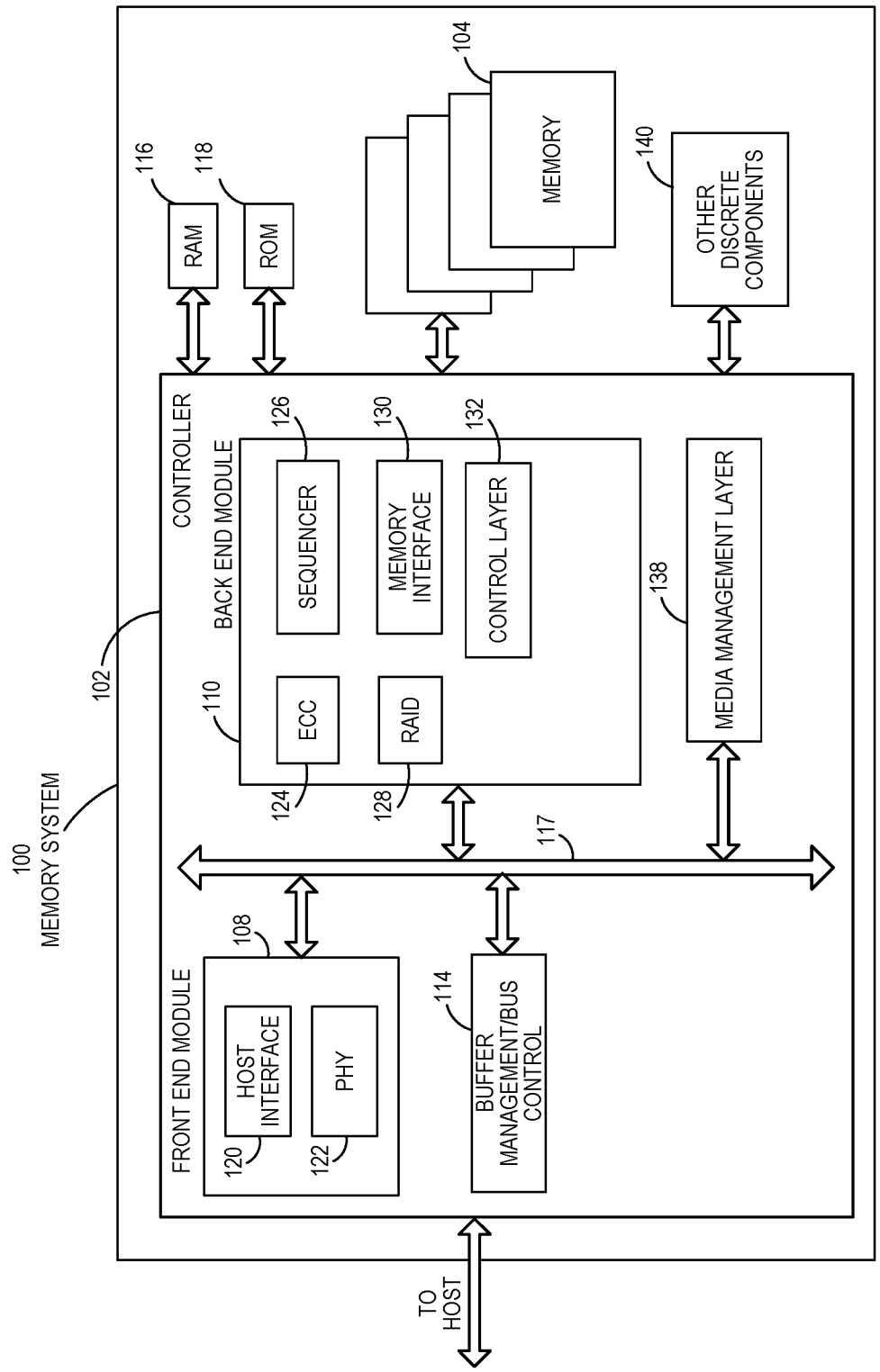
FIG. 2A is a block diagram of example components of a controller of the memory system of FIG. 1A.

FIG. 2A is a block diagram illustrating exemplary components of the controller 102 in more detail. The controller 102 may include a front end module 108 that interfaces with a host, a back end module 110 that interfaces with the memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Example types of the host interface 120 may include, but are not limited to, DDR4, LPDDR4, SATA, SATA Express, SAS, Fibre Channel, USB, PCIe, and NVMe. The host interface 120 may typically facilitate transfer for data, control signals, and timing signals.

The back end module 110 may include an error correction code (ECC) engine or module 124 that encodes the data bytes received from the host, and decodes and error corrects the data bytes read from the non-volatile memory die(s) 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the memory system 100. In some cases, the RAID module 128 may be a part of the ECC engine 124. A memory interface 130 provides the command sequences to the memory die(s) 104 and receives status information from the memory die(s) 104. Along with the command sequences and status information, data to be programmed into and read from the memory die(s) 104 may be communicated through the memory interface 130. In one embodiment, the memory interface 130 may be a double data rate (DDR) interface and/or a Toggle Mode 200, 400, 800, 1,000 or higher interface. A control layer 132 may control the overall operation of back end module 110.

Additional modules of the non-volatile memory system 100 illustrated in FIG. 2A may include a media management layer 138, which performs wear leveling of memory cells of the memory dies 104, address management, and/or facilitates folding operations. The memory system 100 may also include other discrete components 140, such as external electrical interfaces, external RAM, resistors, capacitors, or other components that may interface with controller 102. In some example embodiments, one or more of the RAID module 128, the media management layer 138, and buffer management/bus controller 114 are optional components that may not be included in the controller 102.

Figure 2B:
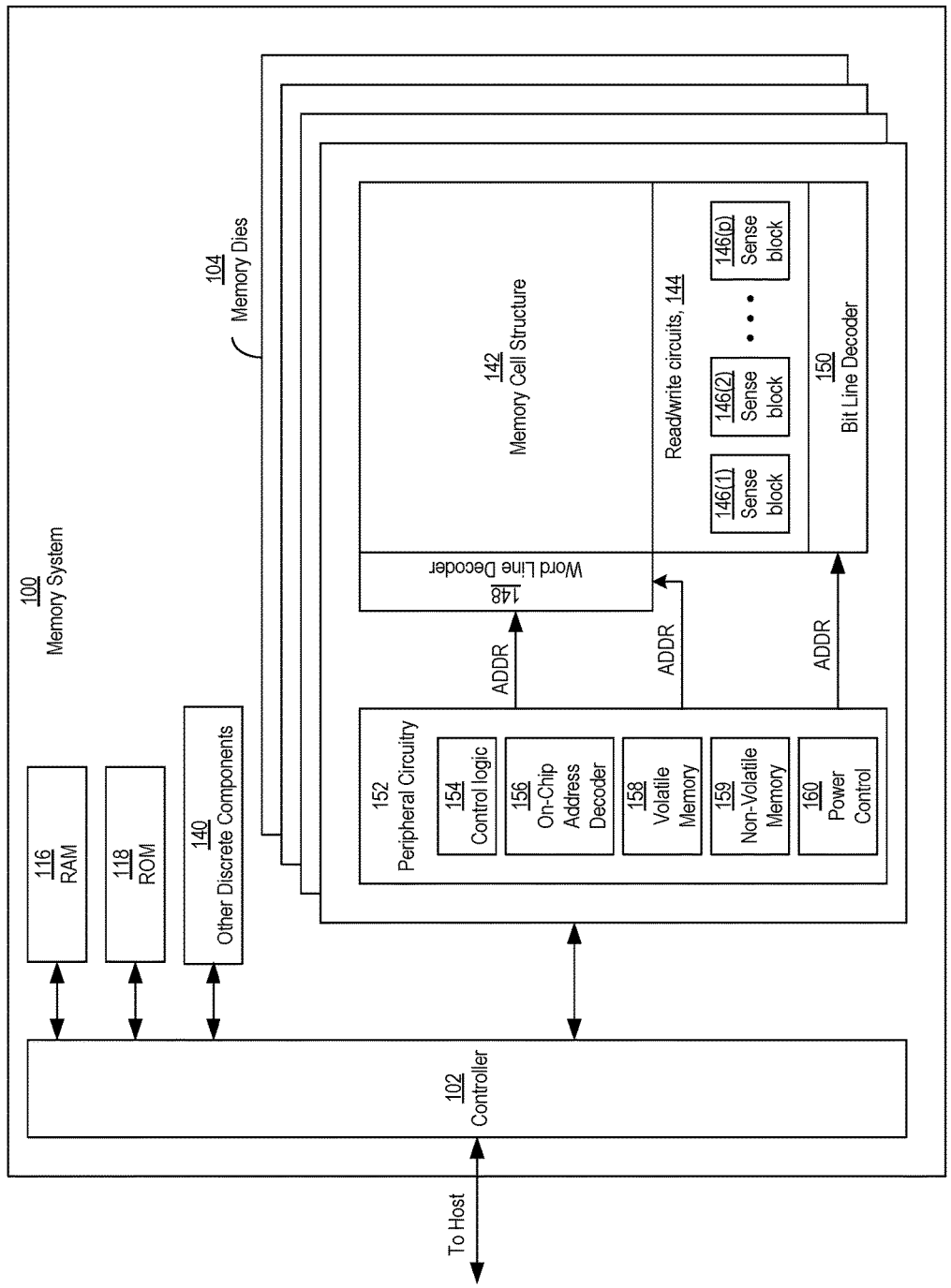
FIG. 2B is a block diagram of example components of a memory die of the memory system of FIG. 1A.

FIG. 2B is a block diagram illustrating exemplary components of a memory die 104 in more detail. The memory die 104 may include a memory cell structure 142 that includes a plurality of memory cells. For some example configurations, the memory cells may be arranged in a two-dimensional or three-dimensional array. For such example configurations, the memory cell structure 142 may be referred to as a memory array.

Example types of memory cells of the memory cell structure 142 include those that have a memory element or portion and a select element or portion. The memory element of the memory cell may be configured to store data at one of a plurality of n-bit logic values, where n is an integer of one or more. Each n-bit logic value may be a binary value, where n represents the number of digits of the binary value. For example, where n is one, the plurality of 1-bit logic values includes a logic 1 value and a logic 0 value. To store the data at an n-bit logic value, the memory element may be configured to be programmed into one of a plurality of states, with each state corresponding to a respective one of a plurality of n-bit logic values. For some example configurations, the states may be resistance states, where different states correspond to different resistances or resistance values of the memory element. For example, a first state may be a high resistance state and a second state may be a low resistance state. A memory element programmed in the high resistance state has a higher resistance than when programmed in the low resistance state. In addition or alternatively, the states may be threshold voltage states, where different states correspond to different threshold voltages to turn on and/or conduct a predetermined, threshold amount of current.

The select element (alternatively referred to as a selector or a selector element or selector portion) may enable the memory element to be programmed to store data or may enable data to be read from the memory element, but itself does not store data or have storage capabilities. In addition or alternatively, the select element may have an associated threshold voltage, and may turn on to conduct current when biased with a voltage at or that exceeds the threshold voltage. The biasing of the select element with a voltage at or above the threshold voltage may allow the memory element to be programmed or read from.

Example types of memory for the memory element, or the memory cell generally, may include resistive random access memory ("ReRAM") or phase change memory ("PCM") although other types of memory, including volatile or other non-volatile memory, may be possible. Additionally, non-limiting example types of select elements include an ovonic threshold switch ("OTS"), a doped chalcogenide alloy material, a thin film silicon material, a metal-metal oxide switch, or a Field Assisted Superlinear Threshold select ("FAST"). In addition or alternatively, the memory cells of the memory cell structure 142 may be configured as cross-point (e.g., 3D XPoint) memory.

The memory cell structure 142 located within and/or over a substrate may be arranged in two or three dimensions, such as a two dimensional memory structure or a three dimensional memory structure with a layer or layers of memory above the base memory layer.

In a two-dimensional memory structure, the memory cells are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory cells may be arranged in the single memory device level in an ordered array, such as in a plurality of rows and/or columns. However, the memory elements may be arrayed in non-regular or non-orthogonal configurations. In addition, as described in further detail below, the memory elements may each be connected two or more bias lines, alternatively referred to as electrodes or contact lines. Types of bias lines include word lines and bit lines. As described in further detail below, to read data from or program data into a given memory cell, the given memory cell may be biased with a voltage difference or differential that includes a high voltage and a low voltage, with the high voltage having a higher voltage level than the low voltage. Two bias lines are coupled to the given memory cell and configured to bias the given memory cell with an associated voltage difference. One of the two bias lines is configured to bias the given memory cell with a high voltage of the voltage difference and the other of the two bias lines is configured to bias the given memory cell with a low voltage of the voltage difference. As used herein, the word lines are those bias lines configured to bias respective memory cells with the high voltage, and the bit lines are those bias lines configured to bias respective memory cells with the low voltage. However, the terms word line and bit line can be used interchangeably or swapped, such that the bias lines configured to bias the memory cells with the high voltage are referred to as bit lines and the bias lines configured to bias the memory cells with the low voltage are referred to as the word lines.

In a three-dimensional memory structure, the memory cells of an array is arranged so that memory cells occupy multiple planes or multiple memory device levels, thereby forming a structure in three dimensions (i.e., in the x, y and z directions, where the one of the directions is substantially perpendicular and the other directions are substantially parallel to the major surface of the substrate).

Additional ways of organizing the memory cells of the memory cell structure 142 may be possible. As a non-limiting example, the memory cells may be organized into blocks, and the blocks may be organized into planes. Additionally, the memory cells of the memory cell structure may be connected to bias or biasing lines, including word lines and bit lines, as previously described. Circuitry on the memory die may be configured to bias the word lines and bit lines with various voltages in order to perform memory operations associated with the memory cells, including read, program, and erase operations.

Figure 3:
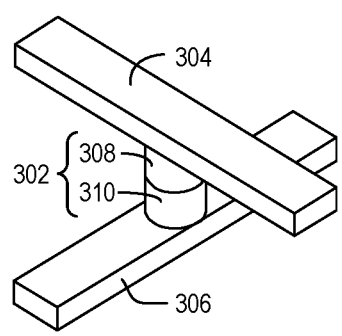
FIG. 3 is a perspective view of an example memory cell coupled to a word line and a bit line.

FIG. 3 shows a perspective view of a memory cell 302 coupled to a word line 304 and a bit line 306. The memory cell 302 may be representative of an example memory cell of the memory cell structure 142 shown in FIG. 2B. Additionally, the word line 304 and the bit line 306 may be representative of respective portions of a word line and a bit line coupled to a memory cell of the memory cell structure 142. Physically, the memory cell 302 may be disposed in between the word line 304 and the bit line 306. Also, in some example configurations, as shown in FIG. 3, the word line 304 and the bit line 306 may be oriented in planes parallel with each other, and extend in perpendicular directions to each other in their respective planes. Additionally, although not shown in FIG. 3, the word line 304 may be one of a plurality word lines extending parallel with each other in an associated plane, and similarly, the bit line 306 may be one of a plurality of bit lines extending parallel with each other in an associated plane.

Additionally, in the example configuration shown in FIG. 3, the memory cell 302 may include a memory element 308 and a select element 310. Although not shown, some embodiments may include electrodes or carbon between the memory element 308 and the select element 308, and/or between these elements 308, 310 and the word line 304 and/or the bit line 306. The memory element 308 and the select element 310 may be coupled to each other. Additionally, in the example configuration shown in FIG. 3, the memory element 308 may be adjacent and/or coupled to the word line 304, and the select element 310 may be adjacent and/or coupled to the bit line 306. In other example configurations, the memory element 308 may be adjacent and/or coupled to the bit line 306, and the select element 310 may be adjacent and/or coupled to the word line 304. A word line is also known as a row line, an interchangeable label as used herein. A bit line may be known as a column line, an interchangeable label as used herein. And what is called a word line line herein can just as well be labeled a bit line, and a bit line labeled as word line so long as consistent in swapping one for the other.

The memory element 308 and the select element 310 may each have an associated threshold voltage. The level of the threshold voltage of the memory element 308 may depend on and/or correspond to a state in which the memory element 308 is programmed and/or a data or logic value of the data that the memory element 308 is storing. In some example configurations, the memory element 308 may be configured to store a single bit of data at either a logic 1 value or a logic 0 value. The memory element 308 may be programmed in either a high resistance state to store the logic 1 value or a low resistance state to store the logic 0 value, or alternatively in the high resistance state to store the logic 0 value and in the low resistance state to store the logic 1 value. The memory element 308 may have a higher threshold voltage when programmed in the high resistance state than when programmed in the low resistance state.

Additionally, for some example configurations, the memory cell 302 may have an associated or total threshold voltage based on a combination of the threshold voltage of the memory element 308 and the threshold voltage of the select element 310. In particular example configurations, the memory element 308 and the select element 310 may be coupled or connected to each other in series such that the total threshold voltage of the memory cell 302 is the sum of the threshold voltage of the memory element 308 and the threshold voltage of the select element 310, or close thereto, when a threshold current to trigger on the memory element 308 is approximately the same as the threshold current to trigger on the select element 310.

As described in further detail below, a read voltage difference may be applied across the memory cell 302 to read data from the memory cell 302, such as by sending or determining the logic level of the data that the memory cell 302 is storing. The voltage difference may be a difference of a first voltage generated at or on the word line 304 and a second voltage generated at or on the bit line 306. The memory cell 302 may be configured to turn on in response to the read voltage difference being at or above the total combined threshold voltage of the memory cell 302; that is for example the sum of the threshold voltage of the memory element 308 and the threshold voltage of the select element 310. When not turned on, the memory cell 302 may be considered turned off and impose a relatively high impedance across the memory cell 302. Also, when turned on, the memory cell 302 may be configured to conduct a cell current. Alternatively, when turned off, the memory cell 302 may instead conduct a relatively smaller cell current, for example "leakage current" that sums up for the other off cells on a word line or bit line, but must not exceed the read current of a selected memory cell in the low resistance state.

To sense or determine the logic level of the data that the memory cell 302 is storing, the read voltage applied between a selected word line and a selected bit line is generated at a voltage level that is greater than the threshold voltage of the select element 310, and further, is greater than the level of the total threshold voltage of the memory cell 302 if the memory element 308 is programmed in the low resistance state, and lower than the level of the total threshold voltage of the memory cell if the memory element 308 is programmed in the high resistance state. This way, whether or not the memory cell 302 conducts cell current in response to the read voltage difference may indicate the logic level (e.g., either a logic 1 value or a logic 0 value) of the data that the memory cell 302 (or particularly the memory element 308) is storing. Whether the memory cell 302 turns on conducts current in response to being biased with the read voltage difference may be referred to as the read response of the memory cell. A read operation to read data from a memory cell is described in further detail below.

Additionally, as described in further detail below, a program voltage difference may be applied across the memory cell 302 to program data into the memory cell 302. For some memory cell technologies, such as phase change memory, the program voltage difference may be applied to cause the memory cell 302 to conduct memory cell current differently in order to store different logic levels of data. For example, a program voltage difference applied to a PCM cell to program the memory element of the PCM cell in a high resistance state may cause the PCM cell to conduct a relatively steady or constant amount of current (e.g., around 100 microAmps ($\mu A$)) for a given period of time and then cause the PCM cell to rapidly transition, for example in less than 2 nanoseconds (ns), to conducting no current or an amount of current relatively close to zero or substantially below the constant current amount. The current transition may be referred to as a fast trailing edge of the memory cell current to program the PCM cell into a high resistance state. Alternatively, a program voltage difference applied to a PCM cell element to program the memory element of the PCM cell in a low resistance state may cause the PCM cell to conduct a gradually decreasing amount of current over the given time period, such as 100 ns, by slowly decreasing the voltage across the memory cell 302.

Referring back to FIG. 2B, the memory die 104 may further include read/write circuits 144 that includes a plurality or p-number of sense blocks (also referred to as sense modules or sense circuits) 146. As described in further detail below, the sense blocks 146 are configured to participate in reading or programming the memory cells.

The memory die 104 may also include a word line decoder (otherwise referred to as a row decoder or an x decoder) 148 and a bit line address (otherwise referred to as a column decoder or a y decoder) 150. The word line decoder 148 may decode a word line address (otherwise referred to as a row address or an x address) and select a particular word line corresponding to the decoded word line address when reading or writing data to/from the memory cells. The bit line decoder 150 may decode a bit line address (otherwise referred to as a column address or a y address) to select a bit line or a particular group of bit lines corresponding to the bit line address when reading or writing data to/from the memory cells.

In addition, the non-volatile memory die 104 may include peripheral circuitry 152. The peripheral circuitry 152 may include control logic circuitry (otherwise referred to as a controller or an on-chip controller) 154, which may be implemented as a state machine, that provides on-chip control of memory operations as well as status information to the controller 102. The peripheral circuitry 152 may also include an on-chip address decoder 156 that provides an address interface between addressing used by the controller 102 and/or a host and the hardware addressing used by the row and column decoders 148, 150. In addition, the peripheral circuitry 152 may also include volatile memory 158 and non-volatile memory 159 other than or separate from the memory cell structure 142. The volatile and non-volatile memory 158, 159 may be used to store data or other information on the memory die 104, such as for previous or present access data states, or alternatives to the control logic 154 or another component of the peripheral circuitry 152 for performance of memory operations on the memory die 104, such as to adjust timing or sequence for read or write operations or to engage read-modify-write operations. Such memory may also serve as firmware in controlling on-chip micro-sequences. An example configuration of the volatile memory 158 may include latches, although other configurations are possible.

In addition, the peripheral circuitry 152 may include power control circuitry 160 that is configured to generate and supply voltages to the memory cell structure 142 and/or the word lines and bit lines coupled to the memory cells of the memory cell structure 142, and/or bias memory cells of the memory cell structure and/or the word lines and bit lines coupled to the memory cells with voltages at certain levels. The voltages that the power control circuitry 160 supplies includes read voltages, program voltages (including program voltage pulses), erase voltages (including erase voltage pulses), as well as other voltages that may be supplied to the word lines and bit lines of the memory cell structure 142, the read/write circuits 144, including the sense blocks 146, and/or other circuit components on the memory die 104. In addition, the power control circuitry 160 may communicate with and/or be controlled by the control logic circuitry 154, the read/write circuits 144, and/or the sense blocks 146 in order to supply the voltages at appropriate levels and appropriate times to carry out the memory operations. For clarity, and unless otherwise specified, the combination of the power control circuitry 160, the read/write circuitry 144, and the sense blocks 146 used to bias word lines and bit lines at appropriate levels during a given memory operation (e.g., a programming operation, a verify operation, a program-verify operation, a read operation, a sense operation within or part of a verify or read operation, or an erase operation) is herein referred to collectively as voltage supply circuitry. Voltage supply circuitry may refer to the power control circuitry 160, the sense block circuitry 146, other circuit components of the read/write circuitry 144, or any combination thereof. The voltage supply circuitry may include any of various circuit topologies or configurations to supply the voltages at appropriate levels to perform the read, write, and erase operations, such as driver circuits, charge pumps, reference voltage generators, and pulse generation circuits, or a combination thereof. Other types of circuits to generate the voltages may be possible.

Figure 4:
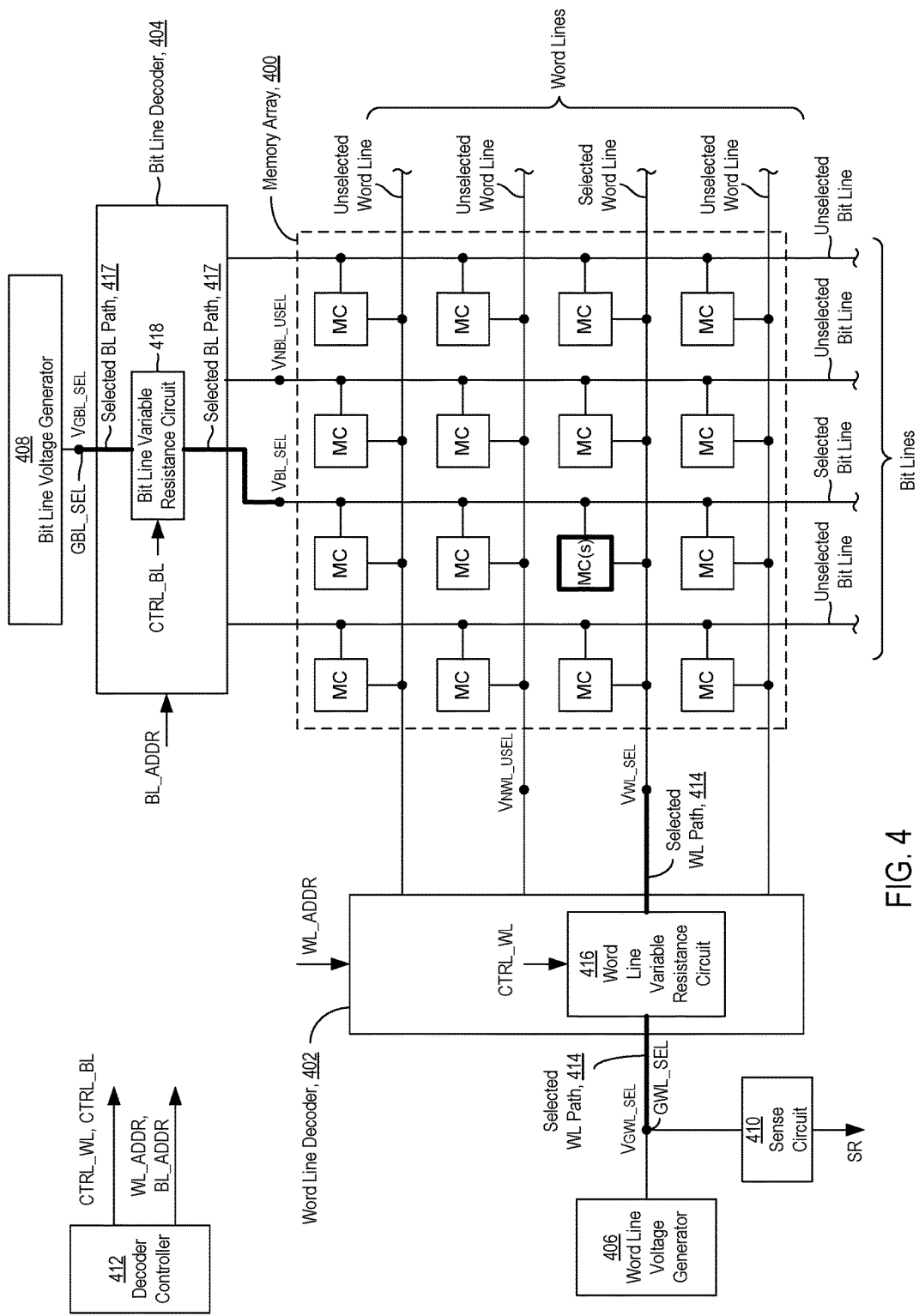
FIG. 4 is a block diagram of example circuitry coupled to a memory array configured to perform read and write operations on a selected memory cell.

FIG. 4 is a block diagram of example circuitry configured to perform a read operation and a program operation on a selected memory cell MC(s). The selected memory cell MC(s) may be one of a plurality of memory cells MC configured in a memory array 400. The memory array 400 may represent at least a portion of the memory cell structure 142 of FIG. 2B.

As will be described in further detail below, the example circuitry of FIG. 4 may be configured to reduce and/or minimize a width of a current spike of memory cell current that the selected memory cell MC(s) conducts when turning on. Reducing the width of the current spike may in turn reduce an amount of energy in the current spike, which in turn reduces the amount of heat the selected memory cell MC(s) generates when conducting the current spike, which in turn reduces and/or minimizes the likelihood that the selected memory cell MC(s) will perform a false write by being programmed into a different state, such as a different resistance state, when conducting the current spike.

For example, in PCM technology, to program the selected memory cell MC(s) into a high resistance state, the circuitry biases the selected memory cell MC(s) to cause the selected memory cell MC(s) to conduct a certain amount of memory cell current (e.g., about 100 microAmps (μA)) for a certain period of time, and then to rapidly decrease the amount of the memory cell current to less than 20 μA or substantially close to 0 μA. This rapid decrease in the amount of the memory cell current is referred to as a fast trailing edge. A false write or read disturb can occur during a read operation where the selected memory cell MC(s), programmed in the low resistance state, turns on and conducts an amount of cell current that rapidly decays in a way that resembles the fast trailing edge, causing the selected memory cell MC(s) to change from being programmed in the low resistance state to being programmed into or closer to the high resistance state, undesirably reducing or eliminating read margin which increases bit error rate (BER) as experienced by the controller 102 or a host.

In further detail, in PCM technology, the selected memory cell MC(s) can be programmed in a high resistance state or a low resistance state. The selected memory cell MC(s) is referred to as being programmed in the high resistance state when its memory element (e.g., the memory element 308 of FIG. 3) is programmed in the high resistance state, and the selected memory cell MC(s) is referred to as being programmed in the low resistance state when its memory element is programmed in the low resistance state.

A read operation is performed on the selected memory cell MC(s) to determine a logic level of the data that the selected memory cell MC(s) is storing by determining whether the memory element of the memory cell MC(s) is programmed in the high resistance state or in the low resistance state. During the read operation, biasing circuitry biases the selected memory cell MC(s) with a voltage difference that reaches toward a predetermined voltage difference level adequate to give the selected memory cell MC(s) the ability to turn on if in the low resistance state—i.e., transition from being in an off state to being in an on state. Whether the selected memory cell MC(s) stays in the off state or transitions to being in the on state indicates whether the selected memory cell MC(s) is programmed in the high resistance state or the low resistance state. In particular, the predetermined voltage difference level is a level that is above the threshold voltage level of a select element of the selected memory cell (e.g., the select element 310 of FIG. 3), and in addition, is either above the total threshold voltage level of the selected memory cell MC(s) when the selected memory cell MC(s) is programmed in the low resistance state (LRS), or below the total threshold voltage level of the selected memory cell MC(s) when the selected memory cell MC(s) is programmed in the high resistance state (HRS). Accordingly, when the predetermined voltage difference level is reached, if the selected memory cell MC(s) is programmed in the high resistance state, then the selected memory cell MC(s) remains turned off (remains in the off state), and if the selected memory cell MC(s) is programmed in the low resistance state, then the selected memory cell MC(s), including the select element (e.g., the OTS), turns on (transitions from the off state to the on state).

In general, for PCM technology, the selected memory cell MC(s) can be in the off state for both when its memory element is programmed in the high resistance state and when its memory element is programmed in the low resistance state. A resistance of its select element may determine or indicate whether the selected memory cell MC(s) is in the on state (turned on) or in the off state (turned off). When the selected memory cell MC(s) is in the off state, the select element may have a resistance at an associated high resistance level, such as on the order of 1 GigaOhms (Ge) in some example configurations, and when the selected memory cell MC(s) is in the on state, the select element may have a resistance at an associated low resistance level, such as on the order of 1 kOhms (k$\Omega$) in some example configurations.

At the start of a read operation to read a logic level of data that the selected memory cell MC(s) is storing, the selected memory cell MC(s) is in an off state (turned off), regardless of whether it is programmed in the high resistance state or in the low resistance state. Prior to start, the memory condition may be a cycle end from a recent or prior, such as an immediately prior read or write cycle, or standby. For PCM, this may force the same voltage on select lines 304 and 306 in FIG. 3. In the off state, the selected memory cell MC(s) may not be conducting any current (or conducting 0 microAmps ($\mu$A) of cell current). As described in further detail below, the read voltage will begin increasing up to the predetermined voltage difference level, and when the predetermined voltage difference level is reached, the behavior of the selected memory cell MC(s)—i.e. whether the selected memory cell MC(s) turns on and conducts significant current above, for example, 10 nanoAmps (nA)—will depend on whether the selected memory cell MC(s) is programmed in the high resistance state or the low resistance state. When the predetermined voltage difference level is reached, if the selected memory cell MC(s) is programmed in the high resistance state, the selected memory cell MC(s) remains turned off because its select element (OTS) remains off, so the resistance the select element stays at its associated high resistance level, and the selected memory cell MC(s) continues to conduct little current, such as less than 1 nA. On the other hand, when the predetermined read voltage difference is reached, if the selected memory cell MC(s) is programmed in the low resistance state, the selected memory cell MC(s) turns on (transitions from the off state to the on state), the resistance of the select element decreases, such as exponentially decreases, from the associated high resistance level of 1 GOhm to the associated low resistance level of 1 kOhm, and the selected memory cell MC(s) conducts significant current, for example greater than 10 pa, over a remaining portion or time period of the read operation. The magnitude waveform of the cell current that the selected memory cell MC(s) conducts when turned on initially during the read operation includes a current spike portion (or just current spike), a current decay portion in which the magnitude decays from a peak amplitude of the current spike down to a current level generally much below the peak amplitude, and a steady-state portion during which the cell current stays at a relatively constant level or within a relatively smaller range of current magnitudes. The current magnitude portions of the current magnitude occur in that order when the selected memory cell MC(s) first turns on during the read operation—the cell current that the selected memory cell MC(s) conducts instantaneously spikes from 0 $\mu$A up to a peak magnitude, and then decays down from the peak to a much lower level, and then remains at a steady state level generally within a range much below the peak level of the current spike.

In some embodiments, the peak amplitude may be on the order of milliAmps (mA), such as 3 mA, and the current level down to which the cell current decays and stays within during the steady state portion may be on the order of tens of microAmps ($\mu$A), such as in a range of 20-35 $\mu$A for example. The relatively steady magnitude level of the cell current may depend on and/or be controlled by current sources that the biasing circuitry uses to generate the initial voltage difference triggering on the select element if the memory element is in the low resistance state.

Accordingly, when the voltage difference across the selected memory cell MC(s) reaches the predetermined voltage difference level, the selected memory cell MC(s) staying in the off state and not conducting current indicates that the selected memory cell MC(s) is programmed in the high resistance state and is thus storing data having a logic level corresponding to the high resistance state. On the other hand, when the voltage difference across the selected memory cell MC(s) reaches the predetermined voltage level exceeding the combined threshold voltage of the select element and the memory element (if in the LRS), the selected memory MC(s) transitions from the on state to the off state and conducts a current spike followed by a current decay, which indicates that the selected memory cell MC(s) is programmed in the low resistance state and is thus storing data having a logic level corresponding to the low resistance state.

The problem of a false write or read disturb occurring during read operations may be due to the current spike and the subsequent current decay that the selected memory cell MC(s) conducts when programmed in the low resistance state and turning on. In particular, the period of current decay may resemble a fast trailing edge used to program the selected memory cell MC(s) in the high resistance state. Too large of a width of the current spike may provide too large of an amount of energy, which in turn heats up the selected memory cell MC(s) too much, causing the selected memory cell MC(s) to undesirably change its resistance state from a low resistance state to a high resistance state, especially since the decay rate of the spike current is in the same range as that used to write a PCM bit into the high resistance state. This event during read, the raising of the resistance and threshold voltage (Vt) of the selected memory cell MC(s) in the low resistance state, is called a read disturb or false write.

The magnitude peak of the current spike may be dependent on inherent properties or characteristics of the memory cell technology. For example, in PCM technology, the peak of the current spike may be the difference between the threshold voltage of the select element of the selected memory cell MC(s) and a hold voltage of the select element, divided by the dynamic resistance, dv/di, of the selected memory cell MC(s). Because the peak of the spike is an inherent property of the memory cell technology, reducing the peak through manipulation of the biasing of the selected memory cell MC(s) may not be feasible. As the voltage across the select element collapses rapidly (less then ins) as it turns on, the voltage previously across it partially transfers to the selected memory element MC(s) as the voltage across the selected memory cell MC(s) decays to the reduced on-voltage across the selected memory cell MC(s), by discharging the charge stored in the capacitance in the drivers and select lines (the decoders, selected word lines and/or bit lines, and/or the conductive paths formed in the decoders connecting the selected word lines and bit lines to global nodes driven by voltage generators (current sources)), causing the temporary spike in current.

The circuitry in FIG. 4 is configured to reduce the likelihood of a read disturb or false write from occurring when reading data from the selected memory cell MC(s) configured to conduct a current spike when biased during a read operation by reducing the width of the peak and increasing rate of decay. The width is a time measurement of how long the memory cell current stays above a predetermined current amount, such as 40 µA. After the current spike reaches its peak, the slower that the memory cell current takes to decay to the predetermined current amount, the larger the width and the more the energy that the current spike carries to heat up the selected memory cell MC(s). Conversely, the faster the memory cell current decays to the predetermined current amount, the smaller the width and the less energy the current spike carries to heat up the selected memory cell MC(s).

The circuitry of FIG. 4 may be configured to reduce and/or minimize the peaks through setting and adjustment of resistances of variable resistance circuits driving the select lines. In further detail, the memory cells MC of the array 400 are coupled to bias lines, including bit lines and word lines. When the selected memory cell MC(s) is to be biased for a read operation or a write operation, paths may be configured to different supply voltages to bias the selected memory cell MC(s) during read and write select. For example, a selected word line path is configured to supply a global selected word line voltage to a selected word line coupled to the selected memory cell MC(s), and a selected bit line path is configured to supply a global selected bit line voltage to a selected bit line coupled to the selected memory cell MC(s).

Variable resistance circuits configured in the paths and driving adjacent paths may be manipulated to reduce the widths of the current spikes. During a read operation, a variable resistance circuit configured in a path (either a word line path or a bit line path) may be configured to set an associated resistance to a high resistance level in advance of or prior to the memory cell turning on. The variable resistance circuit may be configured to have its associated resistance set to the high resistance level when the selected memory cell turns on and conducts the current spike. The variable resistance circuit may then be configured to adjust the associated resistance from the high resistance level to a low resistance level in response to an end time of an initial turn-on time period. When the selected memory cell MC(s) conducts the current spike in response to turning on, current flows through the path in order to pass through the selected memory cell MC(s). By initially setting the variable resistance circuit in the path to have the high resistance level when the selected memory cell MC(s) turns on, the width of the current spike may be smaller or shorter compared to if the variable resistance circuit was set to the low resistance level when selected memory cell MC(s) turns on.

The initial turn-on time period is a time period extending from a turn-on time to the end time. The turn-on time is a time during the read operation when the selected memory cell MC(s) turns on to conduct the current spike, if the selected memory cell MC(s) is in the low resistance state. In addition or alternatively, the turn-on time is a time (e.g., a predetermined time) that the controller is configured to identify as being when the selected memory cell MC(s) turns on, provided it is configured in a state, e.g., a low resistance state, to turn on during the read operation. The turn-on time may serve as a "time-out" in that the turn-on time that the controller is configured to identify may be a final possible time that the selected memory cell MC(s) can turn on to conduct the current spike. If the selected memory cell MC(s) does not turn on to conduct the current spike by the turn-on time, the controller can assume that the selected memory cell MC(s) is configured in another state, e.g, a high resistance state, such that the selected memory cell MC(s) will not turn on and conduct the current spike during a remainder of the read operation.

The end time is a subsequent time occurring after the turn-on time that ends the initial turn-on time period. The end time may correspond to a predetermined or threshold amount of current to which the memory cell current decays after reaching the peak of the current spike.

The variable resistance circuit may be configured to adjust the associated resistance to the low resistance level in response to an end time of an initial turn-on time period through control by a controller, such as a decoder controller as described in further detail below. The controller may be configured to identify the end time, and in response, change or adjust a level, such as a voltage level, of a control signal that it is outputting to the variable resistance circuit. In response to the change in level, the variable resistance circuit may adjust its associated resistance from the high resistance level to the low resistance level.

The controller may be configured to identify the end time of the initial-turn on period in various ways. In some example configurations, the controller may be configured to identify that the end time occurs a predetermined time period after a reference time during a read operation. In some example configurations, the reference time may be a start time of a read operation, for example. The controller may include or utilize a timer that keeps track of an amount of time that has elapsed following the start of the read operation. When the timer indicates that the amount of elapsed time has reached the predetermined time period, the controller may determine that the end time has occurred, and in response, change the level of the control signal to change the resistance level of the variable resistance circuit to the low resistance level.

In other example configurations, the controller may be configured to identify that the end time occurs a predetermined time period—i.e., the initial turn-on time period—after the turn-on time. For these configurations, the turn-on time may be the reference time. The controller may be configured to identify when the turn-on time occurs, and keep track of an amount of time that has elapsed following the turn-on time, such as through use of a timer. When the timer indicates that the amount of elapsed time following the turn-on time has reached the predetermined time period, the controller may determine that the end time has occurred, and in response, change the level of the control signal to change the resistance level of the variable resistance circuit to the low resistance level.

In other example configurations, the end time may be a time that the memory cell current decays down from the peak of the current spike to a predetermined or threshold current level. The controller may be configured to measure the amount of the cell current that the selected memory cell MC(s) is conducting, and identify when the amount of the cell current reaches the threshold current level. In response to detecting that the amount of the cell current has reached the threshold current level, the controller may determine that the end time has occurred, and in response, change the level of the control signal to change the resistance level of the variable resistance circuit to the low resistance level.

In addition, the controller may be configured to identify the turn-on time in various ways similar to the ways in which it detects the end time. For example, the controller may be configured to identify the turn-on time as a time that occurs a predetermined time period after a reference time. When the controller determines that an amount of elapsed time following the reference time has reached the predetermined time period, the controller may determine that the turn-on time has occurred. For such configurations, the controller determines that the turn-on time has occurred irrespective whether the selected memory cell MC(s) has actually turned on.

In other example configurations, the controller may be configured to identify the turn-on time by measuring the amount of the memory cell current and identify when the amount of the memory cell current exceeds a threshold level indicating that the selected memory cell MC(s) is conducting the current spike. In response to detecting that the memory cell current has exceeded the threshold level, the controller may determine that the selected memory cell MC(s) has initially turned on and the turn-on time has occurred.

Other ways of configuring the controller to determine the turn-on time and/or the end time of the initial turn-on time period, and/or other ways to have the variable resistance circuit change from the high resistance level to the low resistance level in response to an end of the initial turn-on time period, may be possible.

In some example configurations, the variable resistance circuit is a component of a word line decoder and/or configured in a selected word line path configured to supply a global selected word line voltage to a selected word line to bias the selected memory cell MC(s). In other example configurations, the variable resistance circuit is a component of a bit line decoder and/or configured in a selected bit line path configured to supply a global selected bit line voltage to a selected bit line to bias the selected memory cell MC(s).

In still other example configurations, the circuitry includes two variable resistance circuits, a first variable resistance circuit configured in the word line decoder and/or in the selected word line path, and a second variable resistance circuit configured in the bit line decoder and/or in the selected word line path. Both the first and second variable resistance circuits may set their respect resistances to a high resistance level prior to the selected memory cell MC(s) turning on and/or prior to the turn-on time, and may adjust their respective resistances to a low resistance level in response to the selected memory cell MC(s) turning on.

In general, the high resistance level is higher than the low resistance level. For some example embodiments, the high resistance level is in a range of a plurality of high resistance levels. In some embodiments, the range of the plurality of high resistance levels extends from 2 kiloohms (k$\Omega$) to 1 G$\Omega$. In other embodiments, the range of the plurality of high resistance levels extends from 40 k$\Omega$ to 80 k$\Omega$. In other example embodiments, the range of the plurality of high resistance levels extends from about 50 k$\Omega$ to about 60 k$\Omega$. In other example embodiments, the range of the plurality of high resistance levels extends from 1 k$\Omega$ to 30 k$\Omega$. In other example embodiments, the range of the plurality of high resistance levels extends from 6 k$\Omega$ to 20 k$\Omega$. In other example embodiments, the range of the plurality of high resistance levels extends from about 12 k$\Omega$ to about 14 k$\Omega$. Also, in some example embodiments, the low resistance level is in a range of a plurality of low resistance levels. In some embodiments, the range of the plurality of low resistance levels extends from 1 k$\Omega$ to 50 k$\Omega$. In other example embodiments, the range of the plurality of low resistance levels extends from 15 k$\Omega$ to 40 k$\Omega$. In other example embodiments, the range of the plurality of low resistance levels extends from about 25 k$\Omega$ to about 30 k$\Omega$. In other example embodiments, the range of the plurality of low resistance levels extends from 100$\Omega$ to 20 k$\Omega$. In other example embodiments, the range of the plurality of low resistance levels extends from 4 k$\Omega$ to 12 k$\Omega$. In other example embodiments, the range of the plurality of low resistance levels extends from about 7 k$\Omega$ to about 9 k$\Omega$.

In addition or alternatively, the high resistance level and the low resistance level may at levels relative to each other such that a difference between the high resistance level and the low resistance level may be in a range of resistance differences. In some example embodiments, the range of resistance differences extends from 10 k$\Omega$ to 50 k$\Omega$. In other example embodiments, the range of resistance differences extends from 20 k$\Omega$ to 40 k$\Omega$. In other example embodiments, the range of resistance differences extends from about 26 k$\Omega$ to about 32 k$\Omega$. In other example embodiments, the range of resistance differences extends from 100$\Omega$ to 10 k$\Omega$. In other example embodiments, the range of resistance differences extends from 2 k$\Omega$ to 8 k$\Omega$. In other example embodiments, the range of resistance differences extends from about 4 k$\Omega$ to 6 k$\Omega$.

In addition, or alternatively, the high resistance level and the low resistance level may be at levels relative to each other such that the high resistance level is at least 20% higher than the low resistance level. In some example embodiments, the high resistance level is at least 50% higher than the low resistance level. In other example embodiments, the high resistance level is at least 500% (five times) higher than the low resistance level.

In some example configurations, the variable resistance circuit includes a transistor circuit that includes one or more transistors. The one or more transistors may be part of a plurality of transistors of a decoder, such as a word line decoder or a bit line decoder. By being configured in a selected word line path or a selected bit line path, the transistor circuit may be configured receive a global selected voltage (e.g., a global selected word line voltage or a global selected bit line voltage) and pass the global selected voltage toward a selected bias line (e.g., the selected word line or the selected bit line) coupled to the selected memory cell MC(s).

Where the variable resistance circuit is configured as a transistor circuit, a controller may operate or function as a bias circuit and may be configured to bias the transistor circuit according to bias settings. Herein, a bias setting is a set of one or more voltages levels of one or more voltages at which to bias one or more transistors of a transistor circuit.

When the controller, as a bias circuit, biases one or more transistors of the transistor circuit according to a bias setting, the controller biases the one or more transistors at the one or more voltage levels of the bias setting. The one of more transistors of the transistor circuit may receive and/or be biased with the one or more voltages at one or more input terminals. During a read operation, prior to the turn-on time, the controller, as a bias circuit, may bias the transistor circuit according to a first bias setting during a bias line set period prior to a turn-on time. As described in further detail below with respect to FIG. 7, the bias line set period may be a bit line set period or a word line set period. The first bias setting may set one or more voltage levels of one or more voltages to configure the transistor circuit to have an associated resistance at the high resistance level. Following enough time for the current spike to decay into the read range of current, such as at the end of the initial turn-on time period, the controller, as a bias circuit, may switch to biasing the transistor circuit according to a second bias setting. The bias circuit may switch from the first bias setting to the second bias setting by adjusting or changing at least one of the voltage levels of at least one of the voltages. The second bias setting may set one or more voltage levels of one or more voltages to configure the transistor circuit to have the associated resistance at the low resistance level. Such transition may be gradual to avoid temporarily increasing the memory cell current above a safe read range (and avoid read disturb); for example maintaining a read current less than 35 µA.

In some example configurations, the one or more transistors of the transistor circuit may be configured as metal-oxide-semiconductor field-effect transistors (MOSFETs). In particular example configurations, where configured as part of a word line decoder, the one or more MOSFETs may each be p-channel metal-oxide-semiconductor field-effect transistors (PMOS transistors). In other example configurations, where configured as part of a bit line decoder, the one or more transistors may each be n-channel metal-oxide-semiconductor field-effect transistors (NMOS transistors).

When configured as MOSFETs, the controller may be configured to generate one or more gate voltages to set an effective gate-to-source voltage of the transistor circuit. Where the transistor circuit includes a single MOSFET, the effective gate-to-source voltage may be the gate-to-source voltage of the single MOSFET. Additionally, where the transistor circuit includes multiple MOSFETs, such as two MOSFETs connected in parallel, the effective gate-to-source voltage may be a combination of the gate-to-source voltages generated across respective gate and source terminals of the MOSFETs.

Prior to the selected memory cell MC(s) turning on and conducting the current spike, the controller is configured to set an effective gate-to-source voltage of the transistor circuit to a reduced voltage level configured to reduce a width of the current spike by increasing the resistance in the drive circuitry, such as in the decoder, which may be an increase in the resistance relative to the amount of the capacitance in the drive circuitry. The reduced voltage level of the effective gate-to-source voltage reduces the width relative to a width that would result if the transistor circuit generates an effective gate-to-source voltage at an increased or full voltage level that is higher than the reduced voltage level when the selected memory cell MC(s) turns on to conduct the current spike. In addition or alternatively, the effective gate-to-source voltage at the reduced voltage level may configure the transistor circuit with an associated resistance at the high resistance level. The increased resistance may isolate a capacitance of the decoder storing charge that the decoder may otherwise supply to the selected memory cell MC(s) when the selected memory cell MC(s) turns on. Isolating the capacitance reduces the rate of charge transfer from charge stored by the capacitance to the selected memory cell MC(s) in the on state, in turn reducing the amount of energy delivered to the selected memory cell MC(s) above the read level that could false write the selected memory cell MC(s) during the read operation. After occurrence of a peak of the current spike, such as when the memory cell current decays to a threshold current amount and/or when the controller identifies the end of an initial turn-on time period, the controller may be configured to increase the effective gate-to-source voltage from the reduced voltage level to the increased voltage level, which may configure the transistor circuit with its associated resistance at the low resistance level.

For example configurations where the variable resistance circuit includes transistor circuity, the resistance is or includes a resistance between two terminals of the transistor circuitry. For transistor circuitry configurations that include a single transistor, the resistance level of the variable resistance circuit is a resistance level of a resistance between two terminals of the single transistor. For configurations that include a plurality of transistors, the resistance level of the variable resistance circuit is a combination (e.g., a series combination or a parallel combination) of resistance levels of resistances, where each of the resistances is between two terminals of a respective one of the plurality of transistors. The high resistance level and/or the low resistance level may depend on a type of the one or more transistors. In general, NMOS transistors have higher electron mobility characteristics than PMOS transistors. As such, configurations that use NMOS transistors may provide high and low resistance levels that are generally lower than the high and low resistance levels that configurations that use PMOS transistors provide. In one example implementation, as described in further detail below, the variable resistance circuit in the word line decoder includes a PMOS transistor that exhibits high and low resistance levels both above 20 kΩ and a voltage difference of around 25-30 kΩ, and the variable resistance circuit in the bit line decoder includes an NMOS transistor that exhibits high and low resistance level both below 15 kΩ and a voltage difference of around 5 kΩ.

The low resistance level, the second bias settings, and/or the increased voltage level of the effective gate-to-source voltage may be configured for a subsequent event associated with the selected memory cell MC(s), where the subsequent event follows the turn-on time. One example subsequent event is a sense result detection event where a sense circuit outputs a sense result signal indicative of a logic value of the data stored in the selected memory cell MC(s). Looking to the output of the sense circuit before the sense result detection event occurs may result in an incorrect determination of the logic value of the data. However, adjusting the resistance from the high resistance level to the low resistance level, switching from the first bias setting to the second bias setting, and/or increasing the effective gate-to-source voltage from the reduced voltage level to the increased voltage level may allow the sense result detection event to occur faster compared to if the adjusting, switching, and/or increasing did not occur after occurrence of the current spike.

Another subsequent event may be a write operation. Adjusting the resistance from the high resistance level to the low resistance level, switching from the first bias setting to the second bias setting, and/or increasing the effective gate-to-source voltage from the reduced voltage level to the increased voltage level may configure the variable resistance circuit, such as the transistor circuit, to provide a current at a sufficiently high amount to perform the write operation and/or at a low enough resistance to avoid larger voltage drops that cause an insufficient current through the selected memory cell MC(s) during the write operation without increasing the write voltage and stress across the select transistors.

For configurations of the variable resistance circuit that include a single transistor, the transistor may have a sufficiently large gate width or channel size that can conduct an amount of current optimized for performing program operations when biased with a maximum gate-to-source voltage. However, such a gate width or channel size may be too large for safe read operations as it may provide too wide a width of the peak current and energy through the selected memory cell MC(s) during read. Accordingly, by first setting gate voltages to increase a resistance and/or decrease a gate-to-source voltage, the single transistor may have an effective gate width or channel size that is optimal for read operations, particularly read operations where the selected memory cell MC(s) conducts a current spike when programmed in a low resistance state. Accordingly, through manipulation of the gate voltage before and after the current spike, the same, single transistor may have effective sizes that are optimal for both read and write operations on the selected memory cell MC(s).

In further detail, the example circuitry shown in FIG. 4 may perform a read operation to read data stored in the selected memory cell MC(s), and a write operation to program data into the selected memory cell MC(s). For a read operation, an amount of the cell current Icell that flows through the selected memory cell MC(s) may indicate a logic value of data stored in the selected memory cell MC(s). As part of the read operation, the circuitry may be configured to sense the cell current Icell in order to determine the logic value of the data. For a program operation, the circuitry may be configured to bias the selected memory cell MC(s) to draw the cell current Icell a certain, predetermined way in order to be configured in a corresponding one of a plurality of predetermined states, such as a high resistance state or a low resistance state, each indicating a different logic value of data that the selected memory cell MC(s) can store. For example, the circuitry may be configured to bias the selected memory cell MC(s) to conduct cell current Icell having a fast trailing edge to be programmed in the high resistance state, and to bias the selected memory cell MC(s) to conduct cell current Icell having a gradual decay to be programmed in the low resistance state, as previously described.

The circuitry configured to perform and/or be involved in the read and write operations may include a word line decoder 402, a bit line decoder 404, a word line voltage generator 406, a bit line voltage generator 408, a sense circuit 410, and a decoder controller 412. In some example configurations, the circuitry may include additional components not shown in FIG. 4, such as circuitry to control the sense circuit 410 for performance of sense operations and/or circuitry to control the word line voltage generator 406 and/or the bit line voltage generator 408.

The word line decoder 402 may represent at least a portion of the word line decoder 148 of FIG. 2B, the bit line decoder 404 may represent at least a portion of the bit line decoder 150 of FIG. 2B, and the word line read voltage generator 406 and the bit line read voltage generator 408 may be components of the voltage supply circuitry. As described in further detail below, the decoder controller 412 may be a component of the control logic 154 of FIG. 2B and configured to control components of the word line decoder 402 and the bit line decoder 404, such as variable resistance circuits and/or transistors, in order to control the biasing of the word lines and the bit lines of the memory array 400 during memory operations.

As shown in FIG. 4, each of the memory cells MC may be coupled to a respective one of a plurality of bit lines and a respective one of a plurality of word lines. In particular, each of the memory cells MC may include a first end or terminal coupled to a respective one of the plurality of bit lines and a second end or terminal coupled to a respective one of the plurality of word lines. For a given read operation to read data from a selected memory cell MC(s) or a given program operation to program data into the selected memory cell MC(s), the other memory cells MC of the array 400 that are biased with voltages but are otherwise not the subject of the sense operation or the program operation are referred to as unselected memory cells. Unselected memory cells are not the subject of the read operation or the program operation in that even though they are simultaneously biased with voltages at the time that the selected word line and bit line are biased with voltages, the circuitry does not determine the logic values of data that the other, unselected memory cells MC may be storing during the read operation, or program data into the unselected memory cells MC during the program operation. As indicated in FIG. 4, for a given read operation or program operation, the word line that is coupled to the selected memory cell MC(s) is referred to as a selected word line. The other word lines coupled to unselected memory cells MC are referred to as unselected word lines. In addition, the bit line that is coupled to the selected memory cell MC(s) is referred to as a selected bit line. The other bit lines coupled to unselected memory cells MC are referred to as unselected bit lines.

In order to perform a read operation on the selected memory cell MC(s), the circuitry may apply a read voltage difference at a predetermined read voltage difference level across the selected memory cell MC(s). How the selected memory cell MC(s) responds to the read voltage difference at the predetermined read voltage difference level—such as whether or how much cell current Icell the selected memory cell MC(s) draws in response to the read voltage difference at the predetermined read voltage difference level—may indicate the logic value of the data that the selected memory cell MC(s) is storing. In order to generate the read voltage difference, the circuitry is configured to generate a selected word line voltage $V_{WL\_SEL}$ on the selected word line (or bias the selected word line with the selected word line voltage $V_{WL\_SEL}$), and generate a selected bit line voltage $V_{BL\_SEL}$ on the selected bit line (or bias the selected bit line with the selected bit line voltage $V_{BL\_SEL}$).

The predetermined read voltage difference level may be the difference between the selected word line voltage $V_{WL\_SEL}$ at a predetermined read selected word line voltage level $V_{WL\_RD}$ and the selected bit line voltage $V_{BL\_SEL}$ at a predetermined read selected bit line voltage level $V_{BL\_RD}$ configured for reading data stored in the selected memory cell MC(s). Depending on the configuration of the memory system 100 and/or the memory technology used for the memory cells MC, the read circuitry may be configured to generate one of the read selected word line voltage level $V_{WL\_RD}$ and the read selected bit line voltage level $V_{BL\_RD}$ higher than the other in order generate the read voltage difference at the read voltage difference level with a predetermined polarity relative to the first and second terminals of the selected memory cell MC(s). In the example configurations described herein, the read selected word line voltage level $V_{WL\_RD}$ is higher than the read selected bit line voltage level $V_{BL\_RD}$. In other words, to perform a read operation, the circuitry is configured to generate a higher voltage on the selected word line compared to the voltage it generates on the selected bit line in order to read data from the selected memory cell MC(s). Other configurations may be possible, including those where the read selected bit line voltage level $V_{BL\_RD}$ is higher than the read selected word line voltage level $V_{WL\_RD}$.

In order to perform a write operation on the selected memory cell MC(s), the circuitry may apply a write or program voltage difference over a period of time to write or program data at one of a plurality of logic levels or values into the selected memory cell MC(s). For single-bit configurations where the selected memory cell MC(s) stores a single bit of data, the logic levels may include a logic 0 value and a logic 1 value. How the selected memory cell MC(s) responds to the program voltage difference, such as how the selected memory cell conducts the cell current Icell, may indicate or determine the logic value of the data that the selected memory cell MC(s) stores. For phase change memory, when the circuitry wants to program the selected memory cell MC(s) to be in the high resistance state, the circuitry may bias the selected memory cell MC(s) with a program voltage difference that causes the selected memory cell MC(s) to conduct the cell current Icell with a current magnitude that has a fast trailing edge, and when the circuitry wants to program the selected memory cell MC(s) to be in the low resistance state, the circuitry may bias the selected memory cell MC(s) with a program voltage difference that causes the selected memory cell MC(s) to conduct the cell current Icell with a magnitude that gradually decays, such as from 70 µA to 30 µA in 100 ns. Depending on the implementation, the high resistance state may correspond to a logic 0 value and the low resistance state may correspond to a logic 1 value, or alternatively the high resistance state may correspond to a logic 1 value and the low resistance state may correspond to a logic 0 value. As with a read operation, in order to generate the program voltage difference to perform a write operation, the circuitry is configured to generate a selected word line voltage $V_{WL\_SEL}$ on the selected word line (or bias the selected word line with the selected word line voltage $V_{WL\_SEL}$), and generate a selected bit line voltage $V_{BL\_SEL}$ on the selected bit line (or bias the selected bit line with the selected bit line voltage $V_{BL\_SEL}$).

To perform either a read operation to read data from the selected memory cell MC(s) or a program operation to program data into the selected memory cell MC(s), the word line voltage generator 406 is configured to generate a global selected word line voltage $V_{GWL\_SEL}$ at a global selected word line node GWL_SEL. The global selected word line voltage $B_{GWL\_SEL}$ generated at the global selected word line node GWL_SEL may be supplied along a selected word line (WL) path 414 extending from the global selected word line node GWL_SEL to the selected word line. The selected word line may be configured to receive and/or be biased with the global selected word line voltage $V_{GWL\_SEL}$ from the selected word line path 414, and generate and bias the selected memory cell MC(s) with the selected word line voltage $V_{WL\_SEL}$ in response to the global selected word line voltage $V_{GWL\_SEL}$.

As shown in FIG. 4, the selected word line path 414 may extend from the global selected word line node GWL_SEL and extend through the word line decoder 402 in order to connect and/or couple to the selected word line. The word line decoder 402 may be configured to selectively connect the global selected word line node GWL_SEL to any one of the word lines for or during a given memory operation. The word line that the word line decoder 402 connects to the global selected word line node GWL_SEL for the given memory operation is the selected word line. The other word lines that the word line decoder 402 is able to connect to the global selected word line node GWL_SEL but does not for the given memory operation are the unselected word lines.

The word line decoder 402 may include a plurality of switches (e.g., transistors) that turn on and off to selectively connect the selected global word line node GWL_SEL to the selected word line and selectively disconnect the selected global word line node GWL_SEL from the other word lines. The switches of the word line decoder 402 may have any of various configurations. Some decoder configurations utilizes a single tier of switches where each word line is connected to a single switch, and where the global selected word line voltage $V_{GWL\_SEL}$ passes through a single switch of the word line decoder 402 in order to reach the selected word line. Other decoder configurations utilize a tree or multiple tiers of switches where various combination of switches in the tiers are turned on and off in order to connect the global selected word line node GWL_SEL to a given selected word line, and the global selected word line voltage $V_{GWL\_SEL}$ passes through at least two switches of the word line decoder 402 in order to reach the selected word line.

For a given read or program operation, a given overall state of the switches configured in on and off states forms the selected word line path 414. In some example configurations, the decoder controller 412 is configured to output a word line address control signal WL_ADDR (which may include a single signal or a plurality of signals) corresponding to the word line address of the selected word line to the word line decoder 402. In response to receipt of the word line address control signal WL_ADDR, the switches of the word line decoder 402 are configured in on and off states corresponding to the word line address control signal WL_ADDR to form the selected word line path 414 from the global selected word line node GWL_SEL to the selected word line. Those word lines that are not electrically connected to the global word line node GWL_SEL and the selected word line path 414 are the unselected word lines during the given read or program operation.

Additionally, the selected word line path 414 may include a word line variable resistance circuit 416 that has an associated resistance, which contributes to an overall resistance of the selected word line path 414. The word line variable resistance circuit 416 is configured to set its associated resistance to a resistance level of a plurality of resistance levels, and further configured to adjust its associated resistance from one resistance level to another resistance level of the plurality of resistance levels. The plurality resistance levels may be discrete resistance levels, or alternatively may be a range continuous resistance levels extending from a minimum resistance level to a maximum resistance level of the range.

The word line variable resistance circuit 416 may be configured to set and/or adjust its associated resistance in response to receipt of a word line control signal CTRL_WL output from the decoder controller 412. In some example configurations, a resistance level to which the word line variable resistance circuit 416 sets its associated resistance corresponds to a level, such as a voltage level, of the word line control signal CTRL_WL. Additionally, the word line variable resistance circuit 416 may adjust its associated resistance from a first resistance level to a second resistance level in response to a corresponding change in level of the word line control signal CTRL_WL. In some example configurations, the word line control signal CTRL_WL may be part of or one of the signals of the word line address control signal WL_ADDR, although in other configurations, the word line control signal CTRL_WL may be separate from the word line address control signal WL_ADDR.

In addition, for some example configurations, the word line variable resistance circuit 416 may include a transistor circuit that includes one or more transistors. As part of the selected word line path 414, the transistor circuit is configured to receive the global selected word line voltage $V_{GWL\_SEL}$ and pass the selected word line voltage $V_{GWL\_SEL}$ to the selected word line. The transistor circuit may have an associated resistance, and is configured to set a resistance level of its associated resistance in response to receipt of the word line control signal CTRL_WL. In particular configurations, the word line control signal CTRL_WL includes one or more voltages, and the transistor circuit is configured to receive the one or more input voltages, and set its resistance to a resistance level corresponding and/or according to one or more voltage levels of the one or more input voltages. Additionally, the transistor circuit may be configured to adjust the resistance level of its resistance circuit in response to a change in voltage level of the one or more input voltages.

In particular example configurations, the transistor circuit includes one or more metal-oxide-semiconductor field-effect transistors (MOSFET), where each of the one or more MOSFETs includes a respective gate terminal configured to receive a voltage of the word line control signal CTRL_WL. In this context, the voltage of the word line control signal CTRL_WL is a gate voltage applied to the gate terminal. The associated resistance of the transistor circuit may include a drain-to-source resistance or a combination of drain-to-source resistances across one or more drain-source terminal pairs of the one or more MOSFETs. A given MOSFET receiving the gate voltage may be configured to set, such as by exhibiting or providing, a drain-to-source resistance at a resistance level dependent on the voltage level of the gate voltage it is receiving. In particular, the drain-to-source resistance of the given MOSFET may be dependent on a magnitude of an associated gate-to-source voltage difference across the gate and source terminals of the given MOSFET. The given MOSFET may have a generally inverse relationship between the magnitude of the gate-to-source voltage difference across its gate and source terminals and the drain-to-source resistance it is exhibiting. Accordingly, adjusting the voltage level of the gate voltage to be closer to the voltage level of the source voltage may decrease the magnitude of the gate-to-source voltage, which in turn may have the effect of increasing the drain-to-source resistance of the given MOSFET. Additionally, adjusting the voltage level of the gate voltage to be further away from the voltage level of the source voltage may increase the magnitude of the gate-to-source voltage, which in turn may have the effect of decreasing the drain-to-source resistance of the given MOSFET.

Additionally, for example configurations where the transistor circuit includes one or more MOSFETs, the transistor circuit may include an effective gate-to-source voltage having an associated effective voltage level. For configurations where the transistor circuit includes a single MOSFET, the effective gate-to-source voltage is the gate-to-source voltage of the single MOSFET, and the associated effective voltage level is the voltage level of the gate-to-source voltage of the single MOSFET. Additionally, for configurations where the transistor circuit includes multiple MOSFETs, the effective gate-to-source voltage is or includes a combination of the gate-to-source voltages of the multiple MOSFETs, and the associated effective voltage level is a combination, such as a sum, of the voltage levels of the gate-to-source voltages.

The decoder controller 412 may be configured to set and/or control setting the associated resistance of the word line variable resistance circuit 416. In particular, the decoder controller 412 may be configured to output the word line control signal CTRL_WL at a level, such as a voltage level, that sets and/or causes the word line variable resistance circuit 416 to set its associated resistance to a resistance level that corresponds to the level of the word line control signal CTRL_WL. Additionally, the decoder controller 412 may be configured to adjust and/or control the adjustment of the associated resistance by adjusting the level, such as the voltage level, of the word line control signal CTRL_WL it is outputting to the word line variable resistance circuit 416.

For configurations where the word line variable resistance circuit 416 includes or is configured as a transistor circuit, the decoder controller 412 may operate or function as a bias circuit that is configured to bias the transistor circuit. The decoder controller 412 may bias the transistor by outputting and/or applying one or more voltages of the word line control signal CTRL_WL to one or more input terminals of the one or more transistors of the transistor circuit. In particular configurations that include one or more MOSFETs, the input terminal is a gate terminal, and the decoder controller 412 may output the word line control signal CTRL_WL as one or more gate voltages that biases one or more gate terminals of the one or more MOSFETs. For example, where the transistor circuit includes a single MOSFET, the decoder controller 412, as a bias circuit, may set and/or control the setting of the associated resistance of the transistor circuit by applying a gate voltage at a certain voltage level to a gate terminal of the single MOSFET. Additionally, the decoder controller 412 may adjust the associated resistance of the word line variable resistance circuit 416 by adjusting a voltage level of the gate voltage it is applying to the gate terminal of the single MOSFET. As another example, where the transistor circuit includes a plurality of MOSFETs, the decoder controller 412, as a bias circuit, may set and/or control the resistance of the word line variable resistance circuit 416 by applying a plurality of gate voltages at respective voltage levels to a plurality gate terminals of the plurality of MOSFETs. Additionally, the decoder controller 412 may adjust the associated resistance of the word line variable resistance circuit 416 by adjusting at least one voltage level of the plurality of gate voltages it is applying to the gate terminals of the plurality of MOSFETs.

Additionally, for configurations where the word line variable resistance circuit 416 includes or is configured as a transistor circuit, the decoder controller 412 may operate or function as a bias circuit by biasing the transistor circuit of the word line decoder 402 according to a word line bias setting. The word line bias setting may include, indicate, and/or specify one or more voltages that are applied to the one or more transistors of the transistor circuit, and the voltage level or plurality of voltage levels of the one or more voltages that are applied to the one or more transistors. The decoder controller 412 may bias the transistor circuit according to the word line bias setting by biasing the one or more transistors of the transistor circuit with one or more voltages at the one or more voltage levels as indicated or specified by the word line bias setting. Additionally, the decoder controller 412, as a bias circuit, may be configured to bias the transistor circuit with different word line bias settings, such as a first word line bias setting and a second word line bias setting. The first and second word line bias settings may differ from each other by including at least one voltage that has different voltage levels. When the decoder controller 412 is biasing the transistor circuit according to the first word line bias setting, the decoder controller 412 may be configured to switch to biasing the transistor circuit with a second word line bias setting by changing or adjusting the voltage level of at least one voltage applied to the transistor circuit.

As described in further detail below, during a read operation, the word line variable resistance circuit 416 may be configured to at least partially control, such as by minimizing, a width of a current spike or spike portion of memory cell current Icell that the selected memory cell MC(s) conducts when it turns on if configured in a particular state, such as a low resistance state. To do so, during the read operation, the word line variable resistance circuit 416 may be configured to set its associated resistance to a high resistance level in advance of, or prior to, the selected memory cell MC(s) turning on and/or in advance of or prior to a turn-on time of the selected memory cell MC(s). The word line variable resistance circuit 416 may be configured to keep or maintain its associated resistance at the high resistance level during an initial turn-on period during which the selected memory cell MC(s) initially turns on and conducts a current spike of the memory cell current Icell. After occurrence of a peak of the current spike, the word line variable resistance circuit 416 may be configured to adjust its associated resistance from the high resistance level to a low resistance level, where the low resistance level is lower than the high resistance level. In some example configurations, the decoder controller 412 is configured to effect the change from the high resistance level to the low resistance level by changing a level of the word line control signal CTRL_WL.

When the selected memory cell MC(s) is configured in the particular state to conduct the current spike when initially turning on, setting the associated resistance of the word line variable resistance circuit 416 to the high resistance level during the current spike may cause the current spike to have a minimized and/or reduced width compared to a width that the current spike would have if the associated resistance of the word line variable resistance circuit 416 is set to the low resistance level. However, after the occurrence of the peak of the current spike, setting the word line variable resistance circuit 416 to the low resistance circuit may advantageously speed up when the sense circuit 410 can determine the logic value of the data stored in the selected memory cell MC(s), such as by allowing the global selected word line voltage $V_{GWL\_SEL}$ to decrease down to below a trip voltage level Vtrp faster than if the word line variable resistance circuit 416 is kept at the high resistance level. In addition or alternatively, the word line variable resistance circuit 416, by being set at the low resistance level after the peak of the current spike occurs, may provide a more optimized resistance level at lower resistance, compared to the high resistance level, to the selected word line path 414 for a subsequent program operation on the selected memory cell MC(s).

Figure 5:
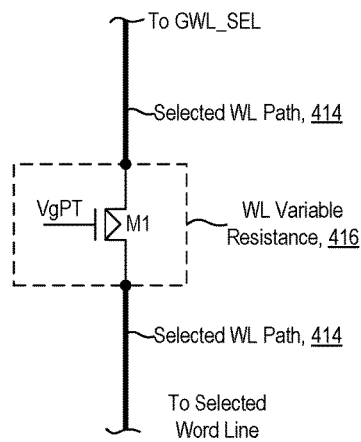
FIG. 5 is a circuit schematic diagram of an example configuration of a word line variable resistance circuit of the example circuitry of FIG. 4.

FIG. 5 shows a circuit diagram of an example configuration of the word line variable resistance circuit 416 of FIG. 4. In the example configuration of FIG. 5, the word line variable resistance circuit 416 is configured as a p-channel MOSFET, referred to as a PMOS transistor M1. As shown in FIG. 5, the PMOS transistor M1 has its drain and source terminals coupled to the selected word line path 414. The PMOS transistor M1 may be one of the switches that the decoder controller 412 is configured to turn on to electrically connected the global selected word line node GWL_SEL to the selected word line. Although not shown in FIG. 5, for some example configurations of the word line decoder 402, one or more other switches (e.g., transistors) may be disposed in the selected word line path 414 between the source terminal of the PMOS transistor M1 and the global selected word line node GWL_SEL and/or in the selected word line path 414 between the drain terminal of the PMOS transistor M1 and the selected word line. In other example configurations, the source terminal may be directly connected to the global selected word line node GWL_SEL and/or the drain terminal may be directly connected to the selected bit line.

The PMOS transistor M1 may be configured to turn on and turn off. When turned on, the PMOS transistor M1 may form a conducting path between its drain and source terminals to allow some amount of current to flow between its drain and source terminals, and in turn, to pass at least a portion of the global selected word line voltage $V_{GWL\_SEL}$ from its source terminal to its drain terminal toward the selected word line. Additionally, when turned off, the PMOS transistor M1 may not form a conducting path between its drain and source terminals, and in turn, may generally be an open circuit that does not pass the global selected word line voltage $V_{GWL\_SEL}$ from its source terminal to its drain terminal toward the selected word line.

The PMOS transistor M1 may include a gate terminal configured to receive a PMOS gate voltage VgPT, which may be a voltage of the word line control signal CTRL_WL described with reference to FIG. 4. The PMOS transistor M1 may be configured to turn on and turn off in response to receipt of the PMOS gate voltage VgPT. Whether the PMOS transistor M1 is turned on or turned off depends on the voltage level of the PMOS gate voltage VgPT. In particular, the PMOS transistor M1 may have an associated threshold voltage VtP. An example associated threshold voltage may be 0.5 V, although other voltage levels may be possible. When the voltage level of the PMOS gate voltage VgPT provides a gate-to-source voltage magnitude across the gate and source terminals of the PMOS transistor M1 that is less than the associated threshold voltage VtP, the PMOS transistor M1 is turned off. When the voltage level of the PMOS gate voltage VgPT provides a gate-to-source voltage magnitude across the gate and source terminals of the PMOS transistor M1 that is greater than or equal to the associated threshold voltage VtP, the PMOS transistor M1 is turned on.

The decoder controller 412 is configured to control the turning on and off of the PMOS transistor M1 by controlling and/or setting the voltage level of the PMOS gate voltage VgPT. In general, the decoder controller 412 decreases the gate-to-source voltage magnitude across the gate and source terminals of the PMOS transistor M1 by increasing the voltage level of the PMOS gate voltage VgPT, and increases the gate-to-source voltage magnitude across the gate and source terminals of the PMOS transistor M1 by decreasing the voltage level of the PMOS gate voltage VgPT. In addition, the decoder controller 412 may generate the PMOS gate voltage VgPT at a certain voltage level that provides a gate-to-source voltage of the PMOS transistor M1 at the associated threshold voltage level VtP. The lower from the certain voltage level that the decoder controller 412 generates the PMOS gate voltage VgPT, the greater the magnitude of the gate-to-source voltage of the PMOS transistor M1. Additionally, the higher above the certain voltage level that the decoder controller 412 generates the PMOS gate voltage VgPT, the lower the magnitude of the gate-to-source voltage of the PMOS transistor M1. Accordingly, the decoder controller 412 may be configured to decrease the voltage level of the PMOS gate voltage VgPT to increase the magnitude of the gate-to-source voltage, and may be configured to increase the voltage level of the PMOS gate voltage VgPT to decrease the magnitude of the gate-to-source voltage.

In addition, the PMOS transistor M1 may have an associated drain-to-source resistance RdsP across its drain and source terminals. For configurations where the word line variable resistance circuit 416 is configured as the PMOS transistor M1, the associated resistance of the word line variable resistance circuit 416 is the drain-to-source resistance RdsP of the PMOS transistor M1. The PMOS transistor M1 may have an inverse relationship between its drain-to-source resistance RdsP and its gate-to-source voltage. That is, the larger the magnitude of the gate-to-source voltage, the smaller the resistance level of its drain-to-source resistance RdsP, and the smaller the magnitude of the gate-to-source voltage, the larger the resistance level of its drain-to-source resistance RdsP.

As previously described, for configurations where the word line variable resistance circuit 416 is implemented as a transistor circuit that includes one or more MOSFETs, the transistor circuit may have an effective gate-to-source voltage. For the single transistor configuration of FIG. 5, the effective gate-to-source voltage of the transistor circuit is the gate-to-source voltage of the PMOS transistor M1, and the voltage level of the effective gate-to-source voltage is the voltage level of the gate-to-source voltage of the PMOS transistor M1.

During a read operation to read data from the selected memory cell MC(s) (FIG. 4), prior to a turn-on time, the decoder controller 412 may generate the PMOS gate voltage VgPT at a first voltage level that sets the gate-to-source voltage to a reduced voltage level, which in turn sets the drain-to-source resistance RdsP to a high or increased resistance level. The decoder controller 412 may maintain the PMOS gate voltage VgPT at the first level during an initial turn-on time period in which the selected memory cell MC(s) conducts a current spike of memory cell current Icell if programmed in a particular state, such as a low resistance state. By maintaining the PMOS gate voltage VgPT at the first level during the initial turn-on time period, the PMOS transistor M1 has a gate-to-source voltage at the reduced voltage level and has its drain-to-source resistance RdsP set to the high or increased resistance level during the initial turn-on period in which the selected memory cell MC(s) is conducting the current spike. At the end of the initial turn-on time period, the decoder controller 412 may begin decreasing the PMOS gate voltage VgPT from the first voltage level to a second voltage level, which in turn increases the gate-to-source voltage to an increased voltage level and decreases the drain-to-source resistance RdsP to a low or decreased resistance level.

The first voltage level at which the decoder controller 412 generates the PMOS gate voltage VgPT may provide a gate-to-source voltage of the PMOS transistor M1 at a reduced voltage level that is configured to reduce a width of the current spike of the memory cell current Icell. The width is reduced relative to a width of a current spike that the selected memory cell MC(s) would conduct if the decoder controller 412 generates the PMOS gate voltage VgPT at the second level such that the gate-to-source voltage is at the increased voltage level and the drain-to-source resistance RdsP is at the low or decreased resistance level during the initial turn-on time period.

The initial turn-on time period may end before a time at which a subsequent event associated with the selected memory cell MC(s) occurs. The subsequent event may be a sense result detection event at which time the sense circuit 410 generates and/or outputs a sense result signal SR indicative of the logic level of the data stored in the selected memory cell MC(s). When the initial turn-on time periods ends, the decreasing of the PMOS gate voltage VgPT, and in turn the increasing of the gate-to-source voltage to the increased voltage level and the decreasing of the drain-to-source resistance RdsP to the low or decreased resistance level, allows the global selected word line voltage $V_{GWL\_SEL}$ to decrease at a faster rate, and in turn the sense result detection event to occur earlier, compared to if decoder controller 412 maintained the PMOS gate voltage VgPT at the first voltage level, and in turn the gate-to-source voltage at the reduced level and drain-to-source resistance RdsP at the high or increased resistance level. The start of a subsequent event may begin after a "time-out" of adequate duration, such as to assure the selected memory cell MC(s) has turned on if in the low resistance state and the resulting current spike has dissipated. Then, the decoder controller 412 may decrease the increased resistance by decreasing the PMOS gate voltage VgPT in order to increase the gate-to-source voltage level.

In addition or alternatively, a subsequent event associated with the selected memory cell MC(s) may be a write operation. An example memory operation where the circuitry may perform a read operation to read data from the selected memory cell MC(s) and immediately thereafter perform a write operation to program data into the selected memory cell MC(s) may be a read-modify-write operation. During the write operation, the selected word line may bias the selected memory cell MC(s) with the selected word line voltage $V_{WL\_SEL}$ at a sufficiently high enough voltage level over at least a portion of a write period to cause the selected memory cell MC(s) to conduct a certain desired amount of current over the portion of the write period in order for the selected memory cell MC(s) to be configured in a particular state (e.g., a low resistance or a high resistance state) to store data at a desired logic level. The PMOS transistor M1 having the gate-to-source voltage at the reduced voltage level and increased drain-to-source resistance RdsP, while suitable for minimizing the width of the current spike during the initial turn-on time period, may provide too large of a voltage drop and/or provide too high of a drain-to-source resistance RdsP to ensure that the selected word line voltage $V_{WL\_SEL}$ is at a sufficiently high enough voltage level and/or that the selected memory cell MC(s) conducts the certain desired amount of cell current during the write period. Accordingly, when the initial turn-on time periods ends, decreasing the PMOS gate voltage VgPT, and in turn increasing of the gate-to-source voltage to the increased voltage level and decreasing the drain-to-source resistance RdsP to the low or decreased resistance level, may allow for a smaller voltage drop across the PMOS transistor M1 and/or allow for a larger amount of current to flow through the PMOS transistor M1, in order to better ensure that the selected word line biases the selected memory cell MC(s) with a sufficiently high selected word line voltage $V_{WL\_SEL}$ and/or the selected memory cell MC(s) is able to conduct a large enough cell current during the write period.

The decoder controller 412 may be configured to generate the PMOS gate voltage VgPT at an associated maximum voltage level and an associated minimum voltage level. The decoder controller 412 may be configured to generate the PMOS gate voltage VgPT at the maximum voltage level to turn off the PMOS transistor M1. When generating the PMOS gate voltage VgPT at the maximum voltage level, the PMOS transistor M1 may have a gate-to-source voltage at a minimum voltage level and a drain-to-source resistance RdsP at a maximum resistance level. Accordingly, when the gate terminal is biased with the PMOS gate voltage at the maximum voltage level, the conductive path between the source and drain terminals of the PMOS transistor M1 has a minimum conductance and/or a maximum resistance. When generating the PMOS gate voltage VgPT at the minimum voltage level, the PMOS transistor M1 may have a gate-to-source voltage at a maximum voltage level and a drain-to-source resistance RdsP at a minimum level. When being biased with the PMOS gate voltage VgPT at the minimum voltage level, the PMOS transistor M1 is referred to as being fully turned on, in that its conductive path between its source and drain terminals has maximum conductance and/or a minimum resistance.

In some example configurations, the maximum and minimum voltage levels may correspond and/or be equal to maximum and minimum voltage supply levels that yield maximum or rail-to-rail voltage swing for the memory operation. Depending on the memory configuration, the memory die 104 may utilize different maximum and minimum voltage levels for read and write operations. In addition or alternatively, the maximum and minimum voltage levels may depend on the memory technology of the PMOS transistor M1. Two types of transistors that may be used for the PMOS transistor M1 include a triple well transistor and a non-triple well transistor. In a particular type of triple well transistor, the minimum PMOS gate voltage level for the transistor selecting the word line high is 4.5 V and the maximum PMOS gate voltage level is 9 V. In a particular type of non-triple well transistor, the minimum PMOS gate voltage level is 0 V and the maximum PMOS gate voltage level is 8 V. These voltage level values are merely exemplary and other minimum and maximum gate voltage levels applied to the PMOS transistor M1 are possible.

In at least some example configurations, the first voltage level of the PMOS gate voltage VgPT that sets the gate-to-source voltage of the PMOS transistor M1 to a reduced voltage level and the drain-to-source resistance RdsP to a high or increased resistance level is an intermediate voltage level in between the maximum voltage level and the minimum voltage level. In particular example configurations, the first voltage level is greater than the associated threshold voltage VtP below the maximum voltage level and greater than the minimum voltage. In one example configuration that uses a non-triple well PMOS transistor, where the maximum voltage level is 8 V, the minimum voltage level is 0 V, and the threshold voltage VtP is 0.5 V, the first voltage level of the PMOS gate voltage is 4.5 V. In another example configuration that uses a triple well PMOS transistor where the maximum voltage is 9 V, the minimum voltage is 4.5 V, and the threshold voltage is 0.5 V, the first voltage level of the PMOS gate voltage is 6 V. These voltage levels are merely exemplary, and other voltage levels more than a threshold voltage VtP below the maximum voltage level and greater than the minimum voltage level may be possible.

When the PMOS transistor M1 is biased with the PMOS gate voltage VgPT at the intermediate voltage level in between the maximum voltage level and the minimum voltage level, the PMOS transistor M1 may be considered partially turned on, in that its conductive path between its source and drain terminals may be in between a maximum and a minimum conductance value and/or resistance value, and some non-zero amount of current may flow through the PMOS transistor M1.

Additionally, in some example configurations, the second voltage level of the PMOS gate voltage VgPT that increases the gate-to-source voltage to an increased voltage level and decreases the drain-to-source resistance RdsP to a low or decreased resistance level may be the minimum voltage level, such that the gate-to-source voltage of the PMOS transistor M1 has maximum magnitude level and the drain-to-source resistance RdsP between the drain and source terminals has a minimum level. In other example configurations, the second level is greater than the minimum voltage level, but is still lower than the first voltage level and provides an increased gate-to-source voltage level and/or a decreased drain-to-source resistance level.

As previously described, one or more subsequent events associated with the selected memory cell MC(s) may occur after the initial turn-on time period, including a sense result detection event and a write operation. The second voltage level may be the level of the PMOS gate voltage at the time the subsequent event occurs or starts. In some example configurations, there may be multiple second voltage levels in that the second voltage level that the PMOS gate voltage VgPT is at when the sense result detection event occurs may be different (e.g., higher) than the second voltage level that the PMOS gate voltage VgPT is at when the write operation begins. As an example illustration, at the end of the initial turn-on time period, the decoder controller 412 may begin decreasing the PMOS gate voltage VgPT from the first voltage level. When the sense result detection event occurs, the decoder controller 412 may be generating the PMOS gate voltage VgPT at a given voltage level lower than the first voltage level, and the decoder controller 412 may continue to decrease the level of the PMOS gate voltage VgPT such that by a later time that the write period begins, the PMOS gate voltage VgPT is at a voltage level lower than both the first voltage level and the given voltage level that the PMOS gate voltage VgPT was at at the time of the sense result detection event. In other configurations, the second voltage level may be a single voltage level that is reached by the time the sense result detection event occurs, and the decoder controller 412 may be configured to maintain the PMOS gate voltage VgPT at the second voltage level from the sense result detection event through at least a portion of the write period. In either case, the decoder controller 412 may be configured to begin decreasing the PMOS gate voltage VgPT at some time after the peak of the spike portion of the cell current Icell and before at least one subsequent event associated with the selected memory cell MC(s) occurs so that by the time the subsequent event occurs, the PMOS transistor M1 has a gate-to-source voltage that has a higher voltage level and a drain-to-source resistance that has a lower resistance level than it had during the initial turn-on time period when it conducted the current spike.

In addition or alternatively, for at least some example configurations, the decoder controller 412 may decrease the PMOS gate voltage VgPT from the first voltage level to the second voltage level so that by the time the subsequent event associated with the selected memory cell MC(s) occurs, the drain-to-source resistance RdsP experiences at least a minimum change (e.g., a minimum decrease) in resistance level. In some example configurations, the change in resistance level may be on the order of kiloOhms (kΩ), such as at least 1 kΩ. In particular example configurations, the change in resistance level may be a decrease on the order of tens of kiloOhms, such as greater than 10 kΩ, 20 kΩ, or 30 kΩ, as non-limiting examples.

Referring back to FIG. 4, in addition, to perform either a read operation to read data from the selected memory cell MC(s) or a program operation to program data into the selected memory cell MC(s), the bit line voltage generator 408 is configured to generate a global selected bit line voltage $V_{GBL\_SEL}$ at a global selected bit line node GWB_SEL. The global selected bit line voltage $V_{GBL\_SEL}$ generated at the global selected bit line node GBL_SEL may be supplied along a selected bit line (BL) path 417 extending from the global selected bit line node GBL_SEL to the selected bit line. The selected bit line may be configured to receive and/or be biased with the global selected bit line voltage $V_{GBL\_SEL}$ from the selected bit line path 417, and generate and bias the selected memory cell MC(s) with the selected bit line voltage $V_{BL\_SEL}$ in response to the global selected bit line voltage $V_{GBL\_SEL}$.

As shown in FIG. 4, the selected bit line path 417 may extend from the global selected bit line node GBL_SEL and extend through the bit line decoder 404 in order to connect and/or couple to the selected bit line. The bit line decoder 404 may be configured to selectively connect the global selected bit line node GBL_SEL to any one of the bit lines for or during a given memory operation. The bit line that the bit line decoder 406 connects to the global selected bit line node GBL_SEL for the given memory operation is the selected bit line. The other bit lines that the bit line decoder 404 is able to connect to the global selected bit line node GBL_SEL but does not for the given memory operation are the unselected bit lines.

Similar to the word line decoder 402, the bit line decoder 404 may include a plurality of switches (e.g., transistors) that turn on and off to selectively connect the selected global bit line node GBL_SEL to the selected bit line and selectively disconnect the selected global bit line node GBL_SEL from the other, unselected bit lines. The switches of the bit line decoder 404 may have any of various configurations, such as a single tier configuration or a multi-tier configuration, as previously described for the word line decoder 402. Depending on the configuration of the bit line decoder 404, the global selected bit line voltage $V_{GBL\_SEL}$ may pass through one or more switches of the bit line decoder 404 in order reach the selected bit line.

For a given read or program operation, a given overall state of the switches configured in on and off states forms the selected bit line path 417. In some example configurations, the decoder controller 412 is configured to output a bit line address control signal BL_ADDR (which may include a single signal or a plurality of signals) corresponding to the bit line address of the selected bit line to the bit line decoder 404. In response to receipt of the bit line address control signal BL_ADDR, the switches of the bit line decoder 404 are configured in on and off states corresponding to the bit line address control signal BL_ADDR to form the selected bit line path 417 from the global selected bit line node GBL_SEL to the selected bit line. Those bit lines that are not electrically connected to the global bit line node GBL_SEL and the selected bit line path 417 are the unselected bit lines during the given read or program operation.

Additionally, the selected bit line path 417 may include a bit line variable resistance circuit 418 that has an associated resistance, which contributes to an overall resistance of the selected bit line path 417. The bit line variable resistance circuit 418 is configured to set its associated resistance to a resistance level of a plurality of resistance levels, and further configured to adjust its associated resistance from one resistance level to another resistance level of the plurality of resistance levels. The plurality resistance levels may be discrete resistance levels, or alternatively may be a range continuous resistance levels extending from a minimum resistance level to a maximum resistance level of the range.

The bit line variable resistance circuit 418 may be configured to set and/or adjust its associated resistance in response to receipt of a bit line control signal CTRL_BL output from the decoder controller 412. In some example configurations, a resistance level to which the bit line variable resistance circuit 418 sets its associated resistance corresponds to a level, such as a voltage level, of the bit line control signal CTRL_BL. Additionally, the bit line variable resistance circuit 418 may adjust its associated resistance from a first resistance level to a second resistance level in response to a corresponding change in level of the bit line control signal CTRL_BL. In some example configurations, the bit line control signal CTRL_BL may be part of or one of the signals of the bit line address control signal BL_ADDR, although in other configurations, the bit line control signal CTRL_BL may be separate from the bit line address control signal BL_ADDR.

In addition, for some example configurations, the bit line variable resistance circuit 418 may include a transistor circuit that includes one or more transistors. As part of the selected bit line path 417, the transistor circuit is configured to receive the global selected bit line voltage $V_{GBL\_SEL}$ and pass the selected bit line voltage $V_{GWL\_SEL}$ to the selected bit line. The transistor circuit may have an associated resistance, and is configured to set a resistance level of its associated resistance in response to receipt of the bit line control signal CTRL_BL. In particular configurations, the bit line control signal CTRL_BL includes one or more voltages, and the transistor circuit is configured to set its resistance to a resistance level corresponding and/or according to one or more voltage levels of the one or more voltages. Additionally, the transistor circuit may be configured to adjust the resistance level of its resistance circuit in response to a change in voltage level of the one or more voltages.

In particular example configurations, the transistor circuit includes one or more MOSFETs, where each of the one or more MOSFETs includes a respective gate terminal configured to receive a voltage of the bit line control signal CTRL_BL. In this context, the voltage of the bit line control signal CTRL_BL is a gate voltage applied to the gate terminal. The associated resistance of the transistor circuit may include a drain-to-source resistance or a combination of drain-to-source resistances across one or more drain-source terminal pairs of the one or more MOSFETs. A given MOSFET receiving the gate voltage may be configured to set, such as by exhibiting or providing, a drain-to-source resistance at a resistance level dependent on the voltage level of the gate voltage it is receiving. In particular, the drain-to-source resistance of the given MOSFET may be dependent on a magnitude of an associated gate-to-source voltage difference across the gate and source terminals of the given MOSFET. The given MOSFET may have a generally inverse relationship between the magnitude of the gate-to-source voltage difference across its gate and source terminals and the drain-to-source resistance it is exhibiting. Accordingly, adjusting the voltage level of the gate voltage to be closer to the voltage level of the source voltage may decrease the magnitude of the gate-to-source voltage, which in turn may have the effect of increasing the drain-to-source resistance of the given MOSFET. Additionally, adjusting the voltage level of the gate voltage to be further away from the voltage level of the source voltage may increase the magnitude of the gate-to-source voltage, which in turn may have the effect of decreasing the drain-to-source resistance of the given MOSFET.

Additionally, for example configurations where the transistor circuit includes one or more MOSFETs, the transistor circuit may include an effective gate-to-source voltage having an associated effective voltage level. For configurations where the transistor circuit includes a single MOSFET, the effective gate-to-source voltage is the gate-to-source voltage of the single MOSFET, and the associated effective voltage level is the voltage level of the gate-to-source voltage of the single MOSFET. Additionally, for configurations where the transistor circuit includes multiple MOSFETs, the effective gate-to-source voltage is or includes a combination of the gate-to-source voltages of the multiple MOSFETs, and the associated effective voltage level is a combination, such as a sum, of the voltage levels of the gate-to-source voltages.

The decoder controller 412 may be configured to set and/or control the setting the associated resistance of the bit line variable resistance circuit 418. In particular, the decoder controller 412 may be configured to output the bit line control signal CTRL_BL at a level, such as a voltage level, that sets and/or causes the bit line variable resistance circuit 418 to set its associated resistance to a resistance level that corresponds to the level of the bit line control signal CTRL_BL. Additionally, the decoder controller 412 may be configured to adjust and/or control the adjustment of the associated resistance by adjusting the level, such as the voltage level, of the bit line control signal CTRL_BL it is outputting to the bit line variable resistance circuit 418.

For configurations where the bit line variable resistance circuit 418 includes or is configured as a transistor circuit, the decoder controller 412 may operate or function as a bias circuit that is configured to bias the transistor circuit. The decoder controller 412 may bias the transistor by outputting and/or applying one or more voltages of the bit line control signal CTRL_BL to one or more input terminals of the one or more transistors of the transistor circuit. In particular configurations that include one or more MOSFETs, the input terminal is a gate terminal, and the decoder controller 412 may output the bit line control signal CTRL_BL as one or more gate voltages that biases one or more gate terminals of the one or more MOSFETs. For example, where the transistor circuit includes a single MOSFET, the decoder controller 412, as a bias circuit, may set and/or control the setting of the associated resistance of the transistor circuit by applying a gate voltage at a certain voltage level to a gate terminal of the single MOSFET. Additionally, the decoder controller 412 may adjust the associated resistance of the bit line variable resistance circuit 418 by adjusting a voltage level of the gate voltage it is applying to the gate terminal of the single MOSFET. As another example, where the transistor circuit includes a plurality of MOSFETs, the decoder controller 412, as a bias circuit, may set and/or control the resistance of the bit line variable resistance circuit 418 by applying a plurality of gate voltages at respective voltage levels to a plurality gate terminals of the plurality of MOSFETs. Additionally, the decoder controller 412 may adjust the associated resistance of the bit line variable resistance circuit 418 by adjusting at least one voltage level of the plurality of gate voltages it is applying to the gate terminals of the plurality of MOSFETs.

Additionally, for configurations where the bit line variable resistance circuit 418 includes or is configured as a transistor circuit, the decoder controller 412 may operate or function as a bias circuit by biasing the transistor circuit of the bit line decoder 404 according to a bit line bias setting. The bit line bias setting may include, indicate, and/or specify one or more voltages that are applied to the one or more transistors of the transistor circuit, and the voltage level or plurality of voltage levels of the one or more voltages that are applied to the one or more transistors. The decoder controller 412 may bias the transistor circuit according to the bit line bias setting by biasing the one or more transistors of the transistor circuit with one or more voltages at the one or more voltage levels as indicated or specified by the bit line bias setting. Additionally, the decoder controller 412, as a bias circuit, may be configured to bias the transistor circuit with different bit line bias settings, such as a first bit line bias setting and a second bit line bias setting. The first and second bit line bias settings may differ from each other by including at least one voltage that has different voltage levels. When the decoder controller 412 is biasing the transistor circuit according to the first bit line bias setting, the decoder controller 412 may be configured to switch to biasing the transistor circuit with a second bit line bias setting by changing or adjusting the voltage level of at least one voltage applied to the transistor circuit.

As described in further detail below, during a read operation, the bit line variable resistance circuit 418 may be configured to at least partially control, such as by minimizing, a width of a current spike or spike portion of memory cell current Icell that the selected memory cell MC(s) conducts when it turns on if configured in a particular state, such as a low resistance state. To do so, during the read operation, the bit line variable resistance circuit 418 may be configured to set its associated resistance to a high resistance level in advance of or prior to the selected memory cell MC(s) turning on and/or in advance of or prior to a turn-on time of the selected memory cell MC(s). The bit line variable resistance circuit 418 may be configured to keep or maintain its associated resistance at the high resistance level during an initial turn-on period during which the selected memory cell MC(s) initially turns on and conducts a current spike of the memory cell current Icell. After occurrence of a peak of the current spike, the bit line variable resistance circuit 418 may be configured to adjust its associated resistance from the high resistance level to a low resistance level, where the low resistance level is lower than the high resistance level. In some example configurations, the decoder controller 412 is configured to effect the change from the high resistance level to the low resistance level by changing a level of the bit line control signal CTRL_BL.

When the selected memory cell MC(s) is configured in the particular state to conduct the current spike when initially turning on, setting the associated resistance of the bit line variable resistance circuit 418 to the high resistance level during the current spike may cause the current spike to have a minimized and/or reduced width compared to a width that the current spike would have if the associated resistance of the bit line variable resistance circuit 418 is set to the low resistance level. However, after the occurrence of the peak of the current spike, setting the bit line variable resistance circuit 418 to the low resistance circuit may advantageously speed up when the sense circuit 410 can determine the logic value of the data stored in the selected memory cell MC(s), such as by allowing the global selected word line voltage $V_{GWL\_SEL}$ to decrease down to below a trip voltage level Vtrp faster than if the bit line variable resistance circuit 418 is kept at the high resistance level. In addition or alternatively, the bit line variable resistance circuit 418, by being set at the low resistance level after the peak of the current spike occurs, may provide a more optimized resistance level, compared to the high resistance level, to the selected bit line path 417 for a subsequent program operation on the selected memory cell MC(s).

Figure 6:
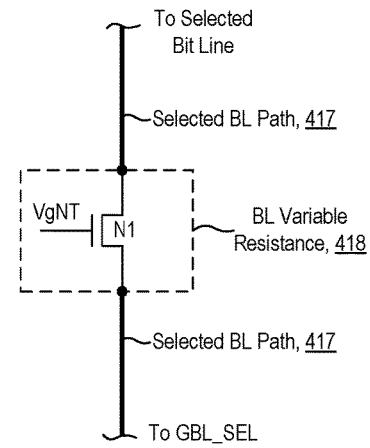
FIG. 6 is a circuit schematic diagram of an example configuration of a bit line variable resistance circuit of the example circuitry of FIG. 4.

FIG. 6 shows a circuit diagram of an example configuration of the bit line variable resistance circuit 418 of FIG. 4. In the example configuration of FIG. 6, the bit line variable resistance circuit 418 is configured as an n-channel MOSFET, referred to as a NMOS transistor N1. As shown in FIG. 6, the NMOS transistor N1 has its drain and source terminals coupled to the selected bit line path 417. The NMOS transistor N1 may be one of the switches that the decoder controller 412 is configured to turn on to electrically connected the global selected bit line node GBL_SEL to the selected bit line. Although not shown in FIG. 6, for some example configurations of the bit line decoder 404, one or more other switches (e.g., transistors) may be disposed in the selected bit line path 417 between the source terminal of the NMOS transistor N1 and the global selected bit line node GBL_SEL and/or in the selected bit line path 417 between the drain terminal of the NMOS transistor N1 and the selected bit line. In other example configurations, the source terminal may be directly connected to the global selected bit line node GBL_SEL and/or the drain terminal may be directly connected to the selected bit line.

The NMOS transistor N1 may be configured to turn on and turn off. When turned on, the NMOS transistor N1 may form a conducting path between its drain and source terminals to allow some amount of current to flow between its drain and source terminals, and in turn, to pass at least a portion of the global selected bit line voltage $V_{GBL\_SEL}$ from its source terminal to its drain terminal toward the selected bit line. Additionally, when turned off, the NMOS transistor N1 may not form a conducting path between its drain and source terminals, and in turn, may generally be an open circuit that does not pass the global selected bit line voltage $V_{GBL\_SEL}$ from its source terminal to its drain terminal toward the selected bit line.

The NMOS transistor N1 may include a gate terminal configured to receive an NMOS gate voltage VgNT, which may be a voltage of the bit line control signal CTRL_BL described with reference to FIG. 4. The NMOS transistor N1 may be configured to turn on and turn off in response to receipt of the NMOS gate voltage VgNT. Whether the NMOS transistor N1 is turned on or turned off depends on the voltage level of the NMOS gate voltage VgNT. In particular, the NMOS transistor N1 may have an associated threshold voltage VtN. An example associated threshold voltage may be 0.5 V, although other voltage levels may be possible. When the voltage level of the NMOS gate voltage VgNT provides a gate-to-source voltage magnitude across the gate and source terminals of the NMOS transistor N1 that is less than the associated threshold voltage VtN, the NMOS transistor N1 is turned off. When the voltage level of the NMOS gate voltage VgNT provides a gate-to-source voltage magnitude across the gate and source terminals of the NMOS transistor N1 that is greater than or equal to the associated threshold voltage VtN, the NMOS transistor N1 is turned on.

The decoder controller 412 is configured to control the turning on and off of the NMOS transistor N1 by controlling and/or setting the voltage level of the NMOS gate voltage VgNT. In general, the decoder controller 412 decreases the gate-to-source voltage magnitude across the gate and source terminals of the NMOS transistor N1 by decreasing the voltage level of the NMOS gate voltage VgNT, and increases the gate-to-source voltage magnitude across the gate and source terminals of the NMOS transistor N1 by increasing the voltage level of the NMOS gate voltage VgNT. In addition, the decoder controller 412 may generate the NMOS gate voltage VgNT at a certain voltage level that provides a gate-to-source voltage of the NMOS transistor N1 at the associated threshold voltage level VtN. The lower from the certain voltage level that the decoder controller 412 generates the NMOS gate voltage VgNT, the lower the magnitude of the gate-to-source voltage of the NMOS transistor N1. Additionally, the higher above the certain voltage level that the decoder controller 412 generates the NMOS gate voltage VgNT, the higher the magnitude of the gate-to-source voltage of the NMOS transistor N1. Accordingly, the decoder controller 412 may be configured to decrease the voltage level of the NMOS gate voltage VgNT to decrease the magnitude of the gate-to-source voltage, and may be configured to increase the voltage level of the NMOS gate voltage VgNT to increase the magnitude of the gate-to-source voltage.

In addition, the NMOS transistor N1 may have an associated drain-to-source resistance RdsN across its drain and source terminals. For configurations where the bit line variable resistance circuit 418 is configured as the NMOS transistor N1, the associated resistance of the bit line variable resistance circuit 418 is the drain-to-source resistance RdsN of the NMOS transistor N1. The NMOS transistor N1 may have an inverse relationship between its drain-to-source resistance RdsN and its gate-to-source voltage. That is, the larger the magnitude of the gate-to-source voltage, the smaller the resistance level of its drain-to-source resistance RdsN, and the smaller the magnitude of the gate-to-source voltage, the larger the resistance level of its drain-to-source resistance RdsN.

As previously described, for configurations where the bit line variable resistance circuit 418 is implemented as a transistor circuit that includes one or more MOSFETs, the transistor circuit may have an effective gate-to-source voltage. For the single transistor configuration of FIG. 6, the effective gate-to-source voltage of the transistor circuit is the gate-to-source voltage of the NMOS transistor N1, and the voltage level of the effective gate-to-source voltage is the voltage level of the gate-to-source voltage of the NMOS transistor N1.

During a read operation to read data from the selected memory cell MC(s) (FIG. 4), prior to a turn-on time, the decoder controller 412 may generate the NMOS gate voltage VgNT at a first voltage level that sets the gate-to-source voltage to a reduced voltage level, which in turn sets the drain-to-source resistance RdsN to a high or increased resistance level. The decoder controller 412 may maintain the NMOS gate voltage VgNT at the first level during an initial turn-on time period in which the selected memory cell MC(s) conducts a current spike of memory cell current Icell if programmed in a particular state, such as a low resistance state. By maintaining the NMOS gate voltage VgNT at the first level during the initial turn-on time period, the NMOS transistor N1 has a gate-to-source voltage at the reduced voltage level and has its drain-to-source resistance RdsN set to the high or increased resistance level during the initial turn-on period in which the selected memory cell MC(s) is conducting the current spike. At the end of the initial turn-on time period, the decoder controller 412 may begin increasing the NMOS gate voltage VgNT from the first voltage level to a second voltage level, which in turn increases the gate-to-source voltage to an increased voltage level and decreases the drain-to-source resistance RdsN to a low or decreased resistance level.

The first voltage level at which the decoder controller 412 generates the NMOS gate voltage VgNT may provide a gate-to-source voltage of the NMOS transistor N1 at a reduced voltage level that is configured to reduce a width of the current spike of the memory cell current Icell. The width is reduced relative to a width of a current spike that the selected memory cell MC(s) would conduct if the decoder controller 412 generates the NMOS gate voltage VgNT at the second level such that the gate-to-source voltage is at the increased voltage level and the drain-to-source resistance RdsN is at the low or decreased resistance level during the initial turn-on time period.

The initial turn-on time period may end before a time at which a subsequent event associated with the selected memory cell MC(s) occurs. The subsequent event may be a sense result detection event at which time the sense circuit 410 generates and/or outputs a sense result signal SR indicative of the logic level of the data stored in the selected memory cell MC(s). When the initial turn-on time periods ends, the increasing of the NMOS gate voltage VgNT, and in turn the increasing of the gate-to-source voltage to the increased voltage level and the decreasing of the drain-to-source resistance RdsN to the low or decreased resistance level, allows the global selected word line voltage $V_{GWL\_SEL}$ to decrease at a faster rate, and in turn the sense result detection event to occur earlier, compared to if decoder controller 412 maintained the NMOS gate voltage VgNT at the first voltage level, and in turn the gate-to-source voltage at the reduced level and drain-to-source resistance RdsN at the high or increased resistance level.

In addition or alternatively, a subsequent event associated with the selected memory cell MC(s) may be a write operation, such as part of a read-modify-write operation, as previously described. During the write operation, the selected bit line may bias the selected memory cell MC(s) with the selected bit line voltage to allow the selected memory cell MC(s) to conduct a certain desired amount of current over the portion of the write period in order for the selected memory cell MC(s) to be configured in a particular state (e.g., a low resistance or a high resistance state) to store data at a desired logic level. The NMOS transistor N1 having the gate-to-source voltage at the reduced voltage level and increased drain-to-source resistance RdsN, while suitable for minimizing the width of the current spike during the initial turn-on time period, may provide too large of a voltage drop and/or provide too high of a drain-to-source resistance RdsN to ensure that the selected memory cell MC(s) conducts the certain desired amount of cell current during the write period. Accordingly, when the initial turn-on time periods ends, increasing the NMOS gate voltage VgNT, and in turn increasing of the gate-to-source voltage to the increased voltage level and decreasing the drain-to-source resistance RdsN to the low or decreased resistance level, may allow for a smaller voltage drop across the NMOS transistor N1 and/or allow for a larger amount of current to flow through the NMOS transistor N1, in order to better ensure the selected memory cell MC(s) is able to conduct a large enough cell current during the write period.

The decoder controller 412 may be configured to generate the NMOS gate voltage VgNT at an associated maximum voltage level and an associated minimum voltage level. The decoder controller 412 may be configured to generate the NMOS gate voltage VgNT at the minimum voltage level to turn off the NMOS transistor N1. When generating the NMOS gate voltage VgNT at the minimum voltage level, the NMOS transistor N1 may have a gate-to-source voltage at a minimum voltage level and a drain-to-source resistance RdsP at a maximum resistance level. Accordingly, when the gate terminal is biased with the NMOS gate voltage at the minimum voltage level, the conductive path between the source and drain terminals of the NMOS transistor N1 has a minimum conductance and/or a maximum resistance. When generating the NMOS gate voltage VgNT at the maximum voltage level, the NMOS transistor N1 may have a gate-to-source voltage at a maximum voltage level and a drain-to-source resistance RdsP at a minimum level. When being biased with the NMOS gate voltage VgNT at the maximum voltage level, the NMOS transistor N1 is referred to as being fully turned on, in that its conductive path between its source and drain terminals has maximum conductance and/or a minimum resistance.

In some example configurations, the maximum and minimum voltage levels may correspond and/or be equal to maximum and minimum voltage supply levels that yield maximum or rail-to-rail voltage swing for the memory operation. Depending on the memory configuration, the memory die 104 may utilize different maximum and minimum voltage levels for read and write operations. In addition or alternatively, the maximum and minimum voltage levels may depend on the memory technology of the NMOS transistor N1. Similar to the PMOS transistor M1 described with reference to FIG. 5, two types of transistors that may be used for the NMOS transistor N1 include a triple well transistor and a non-triple well transistor. In a particular type of triple well transistor, the minimum NMOS gate voltage level is 0 V and the maximum NMOS gate voltage level is 4.5 V. In a particular type of non-triple well transistor, the minimum NMOS gate voltage level is 0 V and the maximum PMOS gate voltage level is 8 V. These voltage level values are merely exemplary and other minimum and maximum gate voltage levels applied to the NMOS transistor N1 are possible.

In some example configurations, the first voltage level of the NMOS gate voltage VgNT that sets the gate-to-source voltage of the NMOS transistor N1 to a reduced voltage level and the drain-to-source resistance RdsN to a high or increased resistance level is an intermediate voltage level in between the maximum voltage level and the minimum voltage level. In particular example configurations, the first voltage level is greater than the associated threshold voltage VtP above the minimum voltage level and less than the maximum voltage level. In one example configuration that uses a non-triple well NMOS transistor, where the maximum voltage level is 8 V, the minimum voltage level is 0 V, and the threshold voltage VtP is 0.5 V, the first voltage level of the NMOS gate voltage is 2 V. In another example configuration that uses a triple well PMOS transistor where the maximum voltage is 9 V, the minimum voltage is 4.5 V, and the threshold voltage is 0.5 V, the first voltage level of the NMOS gate voltage is 2.25 V. These voltage levels are merely exemplary, and other voltage levels more than a threshold voltage VtN above the minimum voltage level and less than the maximum voltage level may be possible.

When the NMOS transistor N1 is biased with the NMOS gate voltage VgNT at the intermediate voltage level in between the maximum voltage level and the minimum voltage level, the NMOS transistor N1 may be considered partially turned on, in that its conductive path between its source and drain terminals may be in between a maximum and a minimum conductance value and/or resistance value, and some non-zero amount of current may flow through the NMOS transistor N1.

In other example configurations, the first voltage level of the NMOS gate voltage VgNT may be the minimum voltage level that turns off the NMOS transistor N1, effectively "floating" the NMOS transistor in the selected bit line path 417. However, in at least some configurations, setting the first voltage level to the minimum voltage level to turn off the NMOS transistor N1 may cause the selected memory cell MC(s) to conduct too small amount of cell current Icell after it turns on, which could cause the selected memory cell MC(s) to oscillate or switch between turning on and turning off, and which in turn could adversely affect the endurance of the selected memory cell MC(s). Conversely, it may be advantageous for the decoder controller 412 to generate the NMOS gate voltage VgNT at an intermediate voltage level so that the NMOS transistor N1 is partially turned on in order to allow the selected memory cell MC(s) to conduct at least a minimally high amount of cell current Icell to prevent the selected memory cell MC(s) from turning off.

Additionally, in some example configurations, the second voltage level of the NMOS gate voltage VgNT that increases the gate-to-source voltage to an increased voltage level and decreases the drain-to-source resistance RdsN to a low or decreased resistance level may be the maximum voltage level, such that the gate-to-source voltage of the NMOS transistor N1 has maximum magnitude level and the drain-to-source resistance RdsN between the drain and source terminals has a minimum level. In other example configurations, the second level is lower than the maximum voltage level, but is still higher than the first voltage level and provides an increased gate-to-source voltage level and/or a decreased drain-to-source resistance level.

As with the PMOS transistor configuration described with reference to FIG. 5, the second voltage level of the NMOS gate voltage VgNT may be the level of the NMOS gate voltage VgNT at the time a subsequent event associated with the selected memory cell MC(s) occurs or starts. In some example configurations, there may be multiple second voltage levels in that the second voltage level that the NMOS gate voltage VgNT is at when the sense result detection event occurs may be different (e.g., lower) than the second voltage level that the NMOS gate voltage VgNT is at when the write operation begins. As an example illustration, at the end of the initial turn-on time period, the decoder controller 412 may begin increasing the NMOS gate voltage VgNT from the first voltage level. When the sense result detection event occurs, the decoder controller 412 may be generating the NMOS gate voltage VgNT at a given voltage level higher than the first voltage level, and the decoder controller 412 may continue to increase the level of the NMOS gate voltage VgNT such that by a later time that the write period begins, the NMOS gate voltage VgNT is at a voltage level higher than both the first voltage level and the given voltage level that the NMOS gate voltage VgNT was at at the time of the sense result detection event. In other configurations, the second voltage level may be a single voltage level that is reached by the time the sense result detection event occurs, and the decoder controller 412 may be configured to maintain the NMOS gate voltage VgNT at the second voltage level from the sense result detection event through at least a portion of the write period. In either case, the decoder controller 412 may be configured to begin increasing the NMOS gate voltage VgNT at some time after the peak of the spike portion of the cell current Icell and before at least one subsequent event associated with the selected memory cell MC(s) occurs so that by the time the subsequent event occurs, the NMOS transistor N1 has a gate-to-source voltage that has a higher voltage level and a drain-to-source resistance that has a lower resistance level than it had during the initial turn-on time period when it conducted the current spike.

In addition or alternatively, for at least some example configurations, the decoder controller 412 may increase the NMOS gate voltage VgNT from the first voltage level to the second voltage level so that by the time the subsequent event associated with the selected memory cell MC(s) occurs, the drain-to-source resistance RdsP experiences at least a minimum change (e.g., a minimum decrease) in resistance level. In some example configurations, the change in resistance level may be on the order of kiloOhms (kΩ), such as at least 1 kΩ. In particular example configurations, the change in resistance level may be a decrease on the order of 4 kΩ or 5 kΩ, as non-limiting examples.

Figure 7:
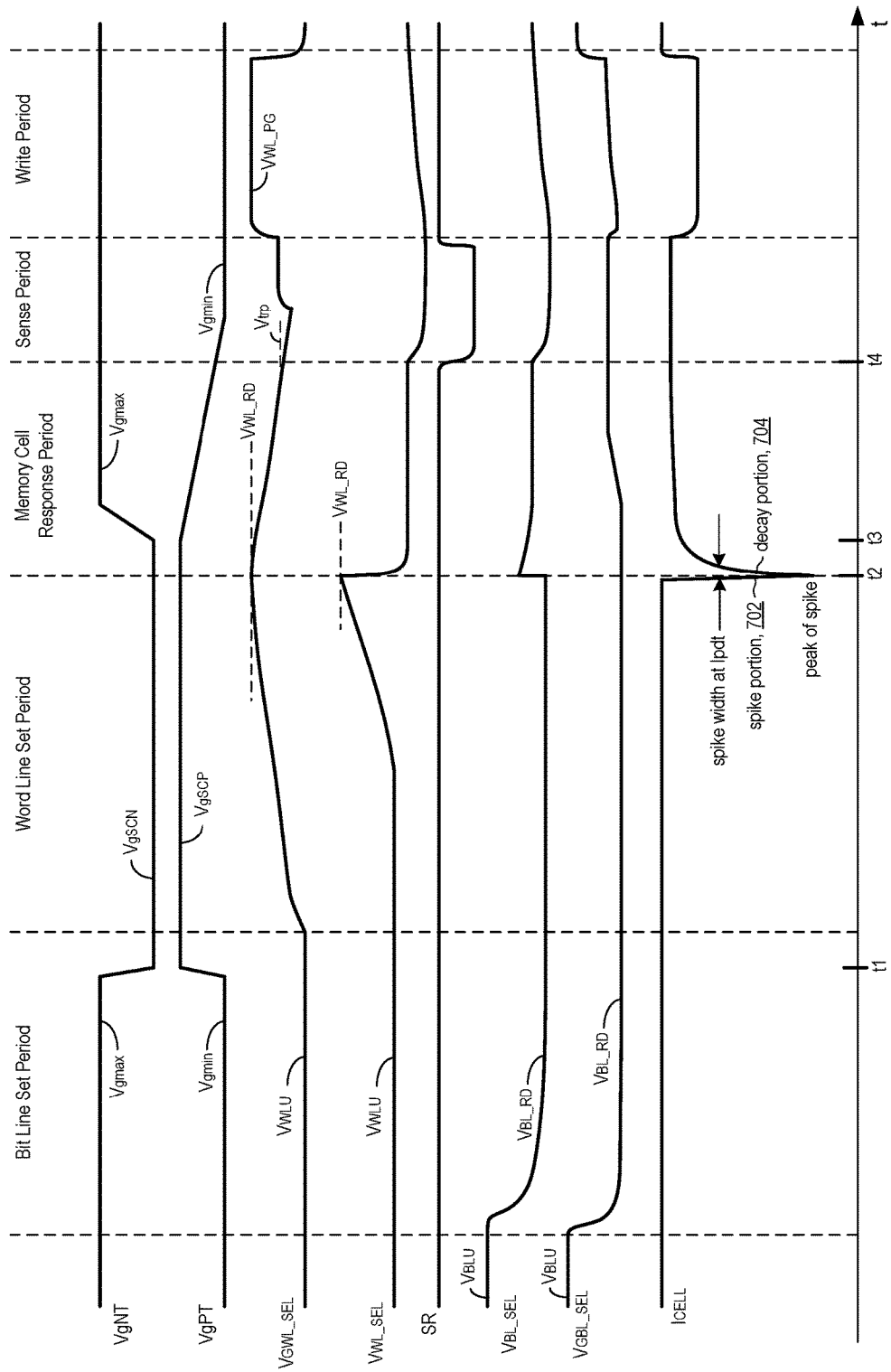
FIG. 7 is a timing diagram of signals, voltages, and currents generated with the circuitry of FIG. 4 during an example read and write operations.

An example read operation to read data from the selected memory cell MC(s), followed by an example write operation to write data into the selected memory cell MC(s) is now described with reference to FIGS. 4-7. FIG. 7 shows a timing diagram of certain signals and voltages generated with the example read circuitry of FIG. 4 during the example read and write operations. The timing diagram further shows the cell current Icell as a function of time during the course of the read and write operations. For the read operation part of the timing diagram, the waveform of the cell current Icell may be indicative of the cell current Icell that the selected memory cell MC(s) may draw when it is programmed in a state that causes the selected memory cell to conduct the cell current Icell at a magnitude level greater than zero or greater than leakage current when biased with the read voltage difference at the predetermined read voltage difference level. Example memory technology may be PCM or ReRAM or other similar two-terminal and/or resistive memory technology, where the memory element of the memory cell is programmed in the low resistance state such that when the predetermined read voltage difference level exceeds the total threshold voltage of the memory element and the select element, the selected memory cell MC(s) responds by initially conducting a current spike or spike portion 702 of the memory cell current Icell that spikes to a peak and then decays down to a relatively steady non-zero amount for a remaining duration of the read operation. For the write operation part of the timing diagram, the waveform of the cell current Icell may be indicative of the cell current Icell that the selected memory cell MC(s) may draw when biased with a write voltage difference that causes the selected memory cell MC(s) to conduct the cell current Icell with a fast trailing edge, for example in order to program the selected memory cell MC(s) in a high resistance state.

In addition, the example read and write operation described with reference to FIG. 7 are described with the word line variable resistance circuit 416 configured as the PMOS transistor M1 of FIG. 5 and with the bit line variable resistance circuit 418 configured as the NMOS transistor N1 of FIG. 6. Accordingly, FIG. 7 shows the word line control signal CTRL_WL applied to the word line variable resistance circuit 416 as the PMOS gate voltage VgPT and the bit line control signal CTRL_BL applied to the bit line variable resistance circuit 416 as the NMOS gate resistance voltage VgNT. In addition, the PMOS and NMOS gate voltages VgPT, VgNT are described with reference to the PMOS and NMOS transistors M1, N1 configured non-triple well transistors, however, similar voltage waveforms may be applicable for configurations using triple well transistors.

Additionally, the example read operation is described as being performed over four periods, including a bit line set period, a word line set period, a memory cell response period, and a sense period. Other ways of separating an example read operation into periods may be possible. Also, the write operation following the read operation is shown as occurring during a write period that follows the sense period of the read operation.

At the start of the read operation (prior to the start of the bit line set period), the circuitry to perform the read operation may be in a standby mode, and the bit line decoder 404 sets the bit lines involved or associated with the read operation to a predetermined unselected bit line level $V_{BLU}$, and the word line decoder 402 sets the word lines involved or associated with the read operation to a predetermined unselected word line level $V_{WLU}$. In addition, in the example read operation shown in FIG. 7, prior to the start of the bit line set period, the decoder controller 412 may initially output the PMOS gate voltage VgPT at a minimum gate voltage level Vg min, which turns the PMOS transistor M1 fully on. For triple well technology, the decoder controller 412 may alternatively output the PMOS gate voltage VgPT at a maximum voltage level Vg max to turn off the PMOS transistor M1. This difference is due to the decoder controller 412 configured to keep non-triple well PMOS transistors turned on during standby, whereas for the decoder controller 412 is configured to keep triple well PMOS transistors turned off during standby. Also, prior to the start of the bit line set period, the decoder controller 412 may initially output the NMOS gate voltage at the maximum voltage level Vg max to turn the NMOS transistor N1 fully on.

In the bit line set period, the bit line decoder 404 sets or initially sets the selected bit line voltage $V_{BL\_SEL}$ of the selected bit line to the predetermined read selected bit line voltage level $V_{BL\_RD}$. To do so, at the start or in an initial portion of the bit line set period, the bit line voltage generator 408 may drive the selected bit line voltage $V_{BL\_SEL}$ low to the read selected bit line voltage level $V_{BL\_RD}$ by transitioning the selected bit line voltage $V_{BL\_SEL}$ from the unselected bit line level $V_{BLU}$ to the read selected bit line voltage level $V_{BL\_RD}$. With the NMOS transistor N1 turned fully on, the selected current path 416 may supply the selected bit line voltage $V_{BL\_SEL}$ at the read selected bit line voltage level $V_{BL\_RD}$ to the selected bit line, which in turn may cause the selected bit line to correspondingly decrease the voltage level of the selected bit line voltage $V_{GBL\_SEL}$ from the unselected bit line level $V_{BLU}$ to the read selected bit line voltage level $V_{BL\_RD}$.

In the word line set period, the word line decoder 402 sets the selected word line voltage $V_{WL\_SEL}$ of the selected word line to the predetermined read selected word line voltage level $V_{WL\_RD}$. To do so, at the start of the word line set period, the word line voltage generator 406 may activate and begin increasing the global selected word line voltage $V_{GWL\_SEL}$ from the unselected word line level $V_{WLU}$ to the read selected word line voltage level $V_{WL\_RD}$. The selected word line path 414 may supply the selected word line voltage $V_{GWL\_SEL}$ to the selected word line, which may cause the selected word line voltage $V_{WL\_SEL}$ to begin increasing from the unselected word line level $V_{WLU}$ to the read selected word line voltage level $V_{WL\_RD}$. As shown in FIG. 7, the selected word line voltage $V_{WL\_SEL}$ may begin increasing from the unselected word line level $V_{WLU}$ with some amount of delay relative to when the global selected word line voltage $V_{GWL\_SEL}$ begins increasing from the unselected word line level $V_{WLU}$. The delay may be due to the selected word line voltage $V_{WL\_SEL}$ not starting to increase until the global selected word line voltage $V_{WL\_SEL}$ is a threshold voltage level above the voltage level of the PMOS gate voltage VgPT. The delay in the selected word line voltage $V_{WL\_SEL}$ starting to increase is described in further detail below. In addition, as shown in FIG. 7, despite the delay, the global selected word line voltage $V_{GWL\_SEL}$ and the selected word line voltage $V_{WL\_SEL}$ may reach or increase to the read selected word line voltage level $V_{WL\_RD}$ at about the same time, marking the end of the word line set period.

When the selected word line voltage $V_{WL\_SEL}$ reaches the read selected word line voltage level $V_{WL\_RD}$, the corresponding read voltage difference across the selected memory cell MC(s) may be at the predetermined read voltage difference level, which may start the memory cell response period. The memory cell response period is a period during which the selected memory cell MC(s) behaves or responds in a certain way in response to the read voltage difference across the selected memory cell MC(s) being at the predetermined read voltage difference level. In particular, if the selected memory cell MC(s) is programmed in a high resistance state, then the read voltage difference at the predetermined read voltage difference level may be below the total threshold voltage of the selected memory cell MC(s). In this case, at the start of and/or during the memory cell response period, the selected memory cell MC(s) may stay turned off and no memory cell current Icell may flow through the selected memory cell MC(s). Alternatively, if the selected memory cell MC(s) is programmed in a low resistance state, then the read voltage difference at the predetermined read voltage difference level may exceed the total threshold voltage of the selected memory cell MC(s). In this case, at the start of the memory cell response period, the selected memory cell MC(s) may turn on or trigger. This latter case, with the selected memory cell MC(s) being in the low resistance state and turning on, is shown in the timing diagram of FIG. 7.

In further detail, in the case when the selected memory cell MC(s) is programmed in the low resistance state and turns on at the start of the memory cell response period, the selected memory cell MC(s) may immediately or rapidly draw or conduct a relatively large amount of memory cell current Icell. Otherwise stated, when the selected memory cell MC(s) initially turns on or triggers, selected memory cell MC(s) conducts a current spike (or spike portion) 702, which is a current magnitude over an instantaneous time period over which the memory cell current Icell spikes in magnitude from zero or substantially zero to a peak current amount. Upon reaching the peak of the current spike 702, the magnitude of the memory cell current Icell through the selected memory cell MC(s) begins to decrease or decay in the memory cell response period until the magnitude of the memory cell current Icell reaches a relatively steady decayed level. The portion of the memory cell current Icell that spikes when the selected memory cell MC(s) initially turns on may be referred to a spike portion 702 of the memory cell current Icell, and the portion of the memory cell current Icell that decays from a peak level of the spike portion to the steady decayed level may be referred to as the decay portion 704 of the memory cell current Icell. The spike and decay portions 702, 704 of the memory cell current Icell are described in further detail below.

In addition, as shown in FIG. 4, the sense circuit 410 may be coupled to the global selected word line node GWL_SEL and configured to sense, detect, and/or receive the global selected word line voltage $V_{WL\_SEL}$. At the end of the memory cell response period, the read operation may transition to the sense period, during which the sense circuit 410 may be configured to sense or detect the voltage level of the global selected word line voltage $V_{WL\_SEL}$ or otherwise use the global selected word line voltage $V_{WL\_SEL}$ to identify a logic level of the data stored in the selected memory cell MC(s). In response to the identification, the sense circuit 410 may be configured to output a sense result signal SR indicating the logic level of the data stored in the selected memory cell MC(s). The sense circuit 410 may be configured to output the sense result signal SR to the sense controller 414 or to another circuit component located on the memory die 104 or external to the memory die 104.

In the sense period, in order to identify the logic level of the data stored in the selected memory cell MC(s), the sense circuit 410 may be configured to compare the voltage level of the global selected word line voltage $V_{GWL\_SEL}$ with a trip voltage level Vtrp. To compare the voltage level of the global selected word line voltage $V_{GWL\_SEL}$ with the trip voltage level Vtrp, the sense circuit 410 may be configured to respond differently depending whether the voltage level of the global selected word line voltage $V_{GWL\_SEL}$ is above or below the trip voltage level Vtrp. For example, in the sense period, in the event that the global selected word line voltage $V_{GWL\_SEL}$ is above the trip voltage level Vtrp, then the sense circuit 410 may be configured to maintain a level (e.g., a voltage level) of the sense result signal SR at a first (e.g., high) level. On the other hand, in the event that the global selected word line voltage $V_{GWL\_SEL}$ is below the trip voltage Vtrp, then the sense circuit 410 may be configured to drop the level of the sense result signal SR from the first level to a second (low) level. The sense result signal SR at the first (high) level may indicate a first logic level or value of the data stored in the selected memory cell MC(s), and the sense result signal SR at the second (low) level may indicate a second logic level or value, different from the first logic level, of the data stored in the selected memory cell MC(s).

Whether the voltage level of the global selected word line voltage $V_{GWL\_SEL}$ is above or below the trip level at the start of the sense period may depend on whether the selected memory cell MC(s) turned on or stayed off in response to the read voltage difference at the predetermined read voltage difference level at the start of the memory cell response period. In the event that the selected memory cell MC(s) is programmed in the high resistance state, then the selected memory cell MC(s) may stay turned off, and in response be prevented from drawing the memory cell current Icell. With the selected memory cell MC(s) staying turned off during the memory cell response period, the voltage level of the global selected word line voltage may stay at a relatively constant level or decrease a relatively small amount such that it is above the trip level Vtrp by the start of the sense period.

On the other hand, in the event that the selected memory cell MC(s) is programmed in the low resistance state, then the selected memory cell MC(s) may turn on (or trigger) and in response, draw the memory cell current Icell, as previously described. When the selected memory cell MC(s) turns on, the amount of the memory cell current Icell that the selected memory cell MC(s) is configured to conduct may cause an amount of current to sink from the global selected word line node GWL_SEL, which in turn may cause the voltage level of the global selected word line voltage $V_{GWL\_SEL}$ to decrease compared to if the selected memory cell MC(s) had not turned on. Although the global selected word line voltage $V_{GWL\_SEL}$ may not decrease at nearly the fast rate at which the voltage level of the selected word line voltage $V_{WL\_SEL}$ dropped due to an effective capacitance provided by the global selected word line node GWL_SEL and the word line decoder 402, the global selected word line voltage $V_{GWL\_SEL}$ may nonetheless decrease to below the trip voltage level Vtrp by the start of the sense period.

FIG. 7 further shows a write operation performed during a write period following the sense period. At the start of the write period, the word line voltage generator 406 may increase the global selected word line voltage $V_{GWL\_SEL}$ to a program selected word line voltage level $V_{WL\_PG}$, and the selected memory cell MC(s) may begin conducting the cell current Icell at an increased amount compared to the relatively steady decayed amount the selected memory cell MC(s) was conducting during the sense period. As an example, relatively steady decayed amount that the selected memory cell MC(s) conducts during the sense period may be in a range of about 30-40 microAmps (μA), and at the start of the write period, the amount of cell current Icell that the selected memory cell MC(s) conducts may be in a range of about 100-110 μA. Additionally, in the example write operation shown in FIG. 7, at the end of the write period, the word line and bit line voltage generators 406, 408 rapidly move the global selected word and bit line voltages $V_{GWL\_SEL}$, $V_{GBL\_SEL}$ to about the same voltage level such that the voltage across the selected memory cell MC(s) is 0 V. This rapid movement of the voltage levels causes the selected memory cell MC(s) to rapidly stop conducting current, which is referred to as a fast trailing edge of the memory cell current Icell. The selected memory cell MC(s) conducting a fast trailing edge of memory cell current from about 100 μA to 0 μA may program the selected memory cell MC(s) in the high resistance state.

Referring back to the read operation, the selected memory cell MC(s), when programmed in the low resistance state, may conduct a current spike 702 of the cell current Icell when initially turning on at the start of the memory cell response period, as previously described. The time marking the start of the memory cell response period may be referred to as the turn-on time, and is shown in FIG. 7 as occurring at a time t2. The current spike 702 may be considered to occur instantaneously, and upon reaching a peak magnitude, the cell current may begin to decay down toward relatively steady decayed level. A width of the current spike may be a time duration for the decay portion 704 to decay down to a predetermined current level Ipdt.

In some example read operations, the NMOS gate voltage VgNT may be initially set at the maximum gate voltage level Vg max at the start of the read operation and/or before the bit line set period, and stay at the maximum gate voltage level Vg max for the duration of the read operation. Similarly, the PMOS gate voltage VgPT may be initially set at the minimum gate voltage level Vg min at the start of the read operation and/or before the bit line set period, and stay at the minimum gate voltage level Vg min for the duration of the read operation.

As previously described, the NMOS gate voltage VgNT at the maximum voltage level Vg max may configure the NMOS transistor N1 to have a minimum resistance. Similarly, the PMOS gate voltage VgPT at the minimum voltage level Vg min may configure the PMOS transistor M1 to have a minimum resistance. Configuring the PMOS and NMOS transistors M1, N1 to have their respective resistances set to minimum resistance levels when the selected memory cell MC(s) turns on and conducts the current spike 702 may cause the current spike 702 to have a width that may be sufficiently large to have an increased likelihood of causing a read disturb or false write.

In order to decrease the likelihood, after biasing the gate terminal of the NMOS transistor N1 with the NMOS gate voltage VgNT at the maximum gate voltage level Vg max to drive down the selected bit line voltage $V_{BL\_SEL}$ to the read selected bit line voltage level $V_{BL\_RD}$, at a time t1 prior to the turn-on time at time t2, the decoder controller 412 may decrease the NMOS gate voltage VgNT from the maximum gate voltage level Vg max to an NMOS spike-control gate voltage level VgSCN. The NMOS spike-control gate voltage level VgSCN may correspond to the first voltage level of the NMOS gate voltage VgNT, and in turn the gate-to-source voltage at the reduced level and the drain-to-source resistance RdsN at the high or increased resistance level, as previously described with reference to FIG. 6. In some example configurations, the NMOS spike-control gate voltage level VgSCN may be an intermediate voltage in between the maximum gate voltage level Vg max and the minimum gate voltage level Vg min. In other example configurations, the NMOS spike-control gate voltage level VgSCN is the minimum gate voltage level Vg min that turns off the NMOS transistor N1 and floats the NMOS transistor N1 in the selected bit line path 417.

In addition, at the time t1 prior to the turn-on time, the decoder controller 412 may increase the PMOS gate voltage VgPT from the minimum gate voltage Vg max to a PMOS spike-control gate voltage VgSCN. The PMOS spike-control gate voltage VgSCN may correspond to the first voltage level of the PMOS gate voltage VgPT, and in turn the gate-to-source voltage at the reduced level and the drain-to-source resistance RdsP at the high or increased resistance level, as previously described with reference to FIG. 5. In addition, the PMOS spike-control gate voltage VgSCN may be an intermediate voltage level in between the maximum voltage level Vg max and the minimum voltage level Vg min.

The decoder controller 412 may be configured to maintain the PMOS gate voltage VgPT at the PMOS spike-control gate voltage VgSCP and the NMOS gate voltage VgNT at the NMOS spike-control gate voltage VgSCN during the word line set period and a through an initial turn-on time period, which may be considered a sub-period of the memory cell response period. The initial turn-on time period may begin at the turn-on time at time t2, and may end at a subsequent time t3 when the memory cell current Icell decays down to a threshold level. In some configurations, the subsequent time t3 may be a predetermine time that the decoder controller 412 is configured to identify as the end of the initial turn-on time period, irrespective of whether the cell current Icell actually decays down to the threshold level.

Setting the PMOS and NMOS gate voltage VgPT, VgNT to their respective PMOS and NMOS spike-control gate voltage levels VgSCP, VgSCN may provide increased resistances in the selected word line and bit lines paths 414, 417, respectively, which in turn may reduce the width of the current spike 702 compared to if the PMOS and NMOS gate voltage VgPT, VgNT kept their gate voltages at the minimum and maximum gate voltage levels Vg min, Vg max, respectively. This in turn, may reduce or minimize the likelihood of the current spike 702 creating a read disturb or false write.

The timing diagram of FIG. 7 shows the PMOS and NMOS gate voltages VgPT, VgNT changing to their respective PMOS and NMOS spike-control gate voltage levels VgSCP, VgSCN at the same time t1. In other example configurations, the PMOS and NMOS gate voltage VgPT, VgNT may change at different times. However, regardless of whether the PMOS and NMOS gate voltages VgPT, VgNT change to their respective PMOS and NMOS spike-control gate voltage levels VgSCP, VgSCN at the same time or at different times, it may be advantageous for the gate voltages to change before the word line set period begins and the global selected word line voltage $V_{GWL\_SEL}$ begins increasing toward the read selected word line voltage level $V_{WL\_RD}$ so that the selected memory cell MC(s) does not turn on and conduct the current spike before the PMOS and NMOS transistors M1, N1 are set to their high resistance levels.

Additionally, although FIG. 7 shows both the PMOS and NMOS gate voltages VgPT, VgNT changing to their respective PMOS and NMOS spike-control gate voltage levels VgSCP, VgSCN, in other example configurations, only one of the gate voltages may change. That is, for other example configurations, the decoder controller 412 may set the PMOS and NMOS gate voltages VgPT, VgNT such that the PMOS gate voltage VgPT may change to the PMOS spike-control gate voltage level VgSCP prior to the turn-on time while the NMOS gate voltage VgNT stays at the maximum gate voltage level Vg max, or the NMOS gate voltage VgNT may change to the NMOS spike-control gate voltage level VgSCN prior to the turn-on time while the PMOS gate voltage VgPT stays at the minimum gate voltage level Vg min.

In addition, as previously described, the selected word line voltage $V_{WL\_SEL}$ may experience a certain amount of delay in starting to increase in the word line set period from the unselected word line voltage level $V_{WLU}$. In particular, the selected word line voltage $V_{WL\_SEL}$ may not begin to increase until the global selected word line voltage $V_{GWL\_SEL}$ increases to a threshold voltage level above the PMOS gate voltage VgPT at the PMOS spike-control gate voltage level VgSCP. Accordingly, the higher the PMOS spike-control gate voltage level VgSCP, the longer the delay, and the longer the word line set period and the longer for the turn-on time to occur. Consequently, setting the PMOS gate voltage VgPT to the PMOS spike-control gate voltage level VgSCP may provide a tradeoff in that the word line set period is lengthened to generate a gate bias that reduces the width of the current spike 702.

Also, in response to the end of the initial turn-on time period at time t3, the decoder controller 412 may be configured to increase the NMOS gate voltage VgNT from the NMOS spike-control gate voltage level VgSCN back up to the maximum gate voltage level Vg max in order to reduce the drain-to-source resistance level RdsN of the NMOS transistor N1. In addition, the decoder controller 412 may be configured to decrease the PMOS gate voltage VgPT from the PMOS spike-control gate voltage level VgSCP back down to the minimum gate voltage level Vg min in order to reduce the drain-to-source resistance level RdsP of the PMOS transistor M1.

Changing the NMOS and PMOS gate voltages VgNT, VgPT may allow a sense result detection event to occur faster compared to if the NMOS and PMOS gate voltages stayed at their respective spike-control gate voltages levels VgSCN, VgSCP. FIG. 7 illustrates the sense result detection event as occurring at a time t4 when the sense result signal SR output by the sense circuit 410 falls below the trip voltage level Vtrp and in turn drops in voltage level. The sense result detection event may mark the time as when a circuit, such as a sense controller or the logic control circuitry 154 of FIG. 2B, can sample or identify the voltage level of the sense result signal SR to determine the logic level of the data stored in the selected memory cell MC(s). In the example read operation shown in FIG. 7, the NMOS gate voltage VgNT is shown as increasing up to the maximum gate voltage level Vg max at a much faster rate than the rate at which the PMOS gate voltage VgPT decreases down to the minimum gate voltage level Vg min. The PMOS gate voltage VgPT may decrease down at a desired rate that allows the sense result detection event to occur (e.g., the global selected word line voltage $V_{GWL\_SEL}$ to fall below the trip voltage level Vtrp) faster than if the PMOS gate voltage VgPT stayed at the PMOS spike-control gate voltage level VgSCP, but does not decrease down too fast so as not to allow an excess amount of cell current Icell through the selected memory cell MC(s) while the memory cell current Icell is still decaying.

Additionally, as previously described, during the write period, the selected memory cell MC(s) may conduct the cell current at or around a certain current amount greater than the amount it conducts during the memory cell response and sense periods. By increasing the NMOS gate voltage VgNT to the maximum gate voltage level Vg max and decreasing the PMOS gate voltage VgPT to the minimum gate voltage level Vg min by the start of the write period, the PMOS and NMOS transistors M1, N1 may be configured with low resistance levels more suitable than the high resistance levels for biasing the selected word lines and bit lines and for allowing the certain current amount to flow through the selected memory cell MC(s) during the write period.

Figure 8:
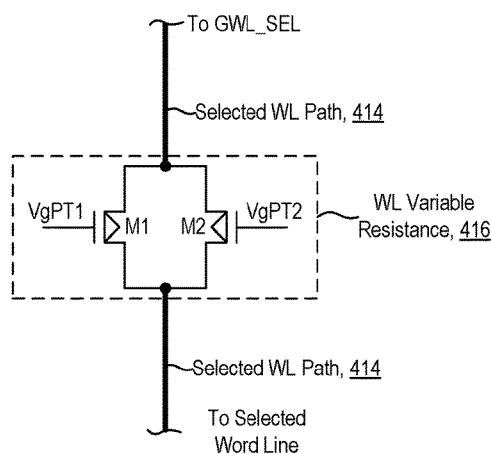
FIG. 8 is a circuit schematic diagram of another example configuration of the word line variable resistance circuit of the example circuitry of FIG. 4.

FIG. 8 is a circuit schematic of another example configuration of the word line variable resistance circuit 416 of FIG. 4. Like the configuration of FIG. 5, the word line variable resistance circuit 416 is configured as a transistor circuit. However, instead of a single PMOS transistor configuration as in FIG. 5, the configuration in FIG. 8 includes two PMOS transistors M1, M2 connected in parallel with each other. The first PMOS transistor M1 is configured to receive a first PMOS gate voltage VgPT1 from the decoder controller 412, and the second PMOS transistor M2 is configured to receive a second PMOS gate voltage VgPT2 from the decoder controller 412. The first PMOS transistor M1 may be optimally sized, such as by having an optimal gate width, for minimizing the width of the current spike 702, and the second PMOS transistor M2 may be optimally sized, such as by having an optimal gate width, for write operations. Accordingly, the second PMOS transistor M2 may have a larger size, such as a larger gate width, than the first PMOS transistor. An effective gate-to-source voltage of the transistor circuit of FIG. 8 may include a combination, such as a sum, of the gate-source voltages of the first and second PMOS transistors.

Figure 10:
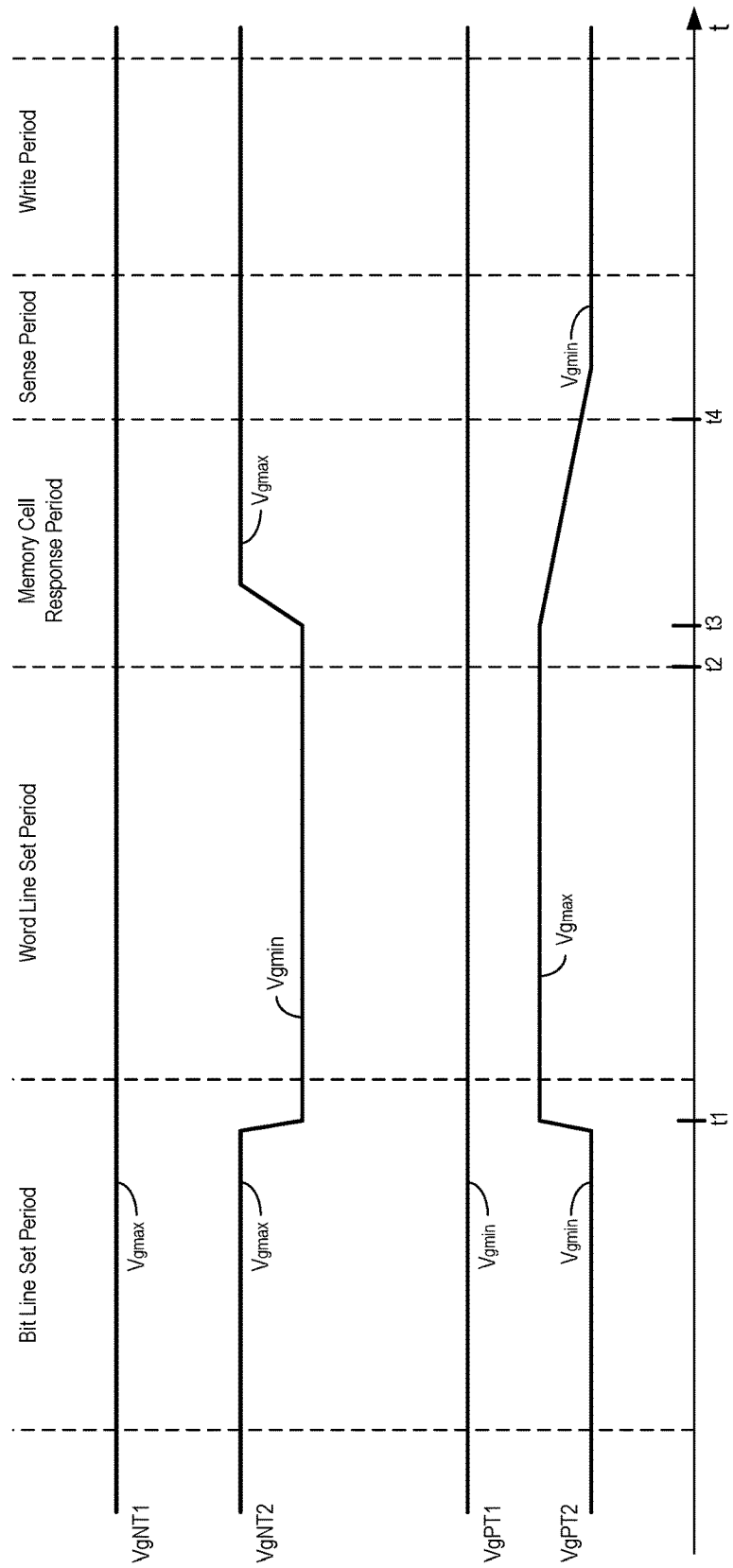
FIG. 10 is a timing diagram of gate voltages applied to the transistor circuits of FIGS. 8 and 9 for performance of the read and write operations of FIG. 7.

FIG. 10 shows an example timing diagram of the gate voltages VgPT1, VgPT2 applied to the gate terminals of the first and second PMOS transistors M1, M2. The other voltage and current waveforms common to the timing diagram of FIG. 7 are omitted for clarity. As shown in FIG. 10, the PMOS gate voltage VgPT1 applied to the first PMOS transistor M1 is always kept at the minimum gate voltage level Vg min to keep the first PMOS transistor M1 fully on during the course of the read and write operations. However, at time t1 prior to the turn-on time, the decoder controller 412 may output the second PMOS gate voltage VgPT2 at the maximum gate voltage level Vg max to turn off the second PMOS transistor M2 optimized for the events following the initial turn-on period. The setting of the second PMOS gate voltage VgPT2 to the maximum gate voltage level Vg max may provide the effective gate-to-source voltage of the transistor circuit to have a reduced level, and an effective or equivalent resistance of the two PMOS transistors M1, M2 to have an increased resistance level. Subsequently, in response to the initial turn-on time period ending at time t3, the decoder controller 412 may begin decreasing the second PMOS gate voltage VgPT2 back down to the minimum gate voltage level Vg min to turn on the second PMOS transistor M2, which in turn may increase the effective gate-to-source voltage to an increased level and decrease the effective or equivalent resistance of the two PMOS transistors M1, M2.

Figure 9:
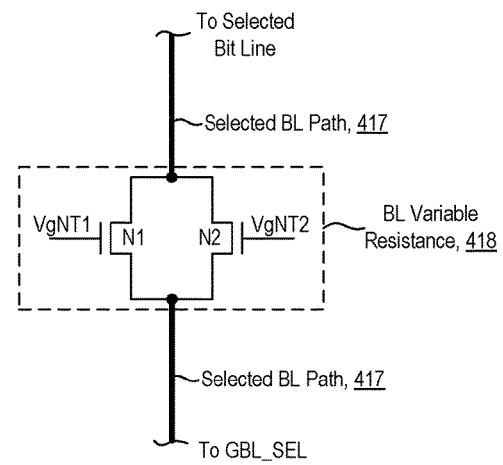
FIG. 9 is a circuit schematic diagram of another example configuration of the bit line variable resistance circuit of the example circuitry of FIG. 4.

FIG. 9 is a circuit schematic of another example configuration of the bit line variable resistance circuit 418 of FIG. 4. Like the configuration of FIG. 6, the bit line variable resistance circuit 418 is configured as a transistor circuit. However, instead of a single NMOS transistor configuration as in FIG. 6, the configuration in FIG. 9 includes two NMOS transistors N1, N2 connected in parallel with each other. The first NMOS transistor N1 is configured to receive a first NMOS gate voltage VgNT1 from the decoder controller 412, and the second NMOS transistor N2 is configured to receive a second NMOS gate voltage VgNT2 from the decoder controller 412. The first NMOS transistor N1 may be optimally sized, such as by having an optimal gate width, for minimizing the width of the current spike 702, and the second NMOS transistor N2 may be optimally sized, such as by having an optimal gate width, for write operations. Accordingly, the second NMOS transistor N2 may have a larger size, such as a larger gate width, than the first NMOS transistor N2. An effective gate-to-source voltage of the transistor circuit of FIG. 9 may include a combination, such as a sum, of the gate-source voltages of the first and second NMOS transistors.

Referring back to FIG. 10, the NMOS gate voltage VgNT1 applied to the first NMOS transistor N1 is always kept at the maximum gate voltage level Vg max to keep the first NMOS transistor N1 fully on during the course of the read and write operations. However, at time t1 prior to the turn-on time, the decoder controller 412 may output the second NMOS gate voltage VgNT2 at the minimum gate voltage level Vg min to turn off the second NMOS transistor N2 optimized for the events following the initial turn-on period. The setting of the second NMOS gate voltage VgNT2 to the minimum gate voltage level Vg min may provide the effective gate-to-source voltage of the transistor circuit to have a reduced level, and an effective resistance of the two NMOS transistors N1, N2 to have an increased resistance level. Subsequently, in response to the initial turn-on time period ending at time t3, the decoder controller 412 may begin increasing the second NMOS gate voltage VgNT2 back up to the maximum gate voltage level Vg max to turn on the second NMOS transistor N2, which in turn may increase the effective gate-to-source voltage to an increased level and decrease the effective or equivalent resistance of the two NMOS transistors N1, N2.

A means for supplying a voltage to bias a memory cell during a read operation to read data from the memory cell, in various embodiments, may include the selected word line path 414 that supplies the global selected word line voltage $V_{GWL\_SEL}$ to the selected word line, or the selected bit line path 417 that supplies the global selected bit line voltage $V_{GBL\_SEL}$ to the selected bit line, or the like. Other embodiments may include similar or equivalent means for supplying a voltage to bias a memory cell.

A means for setting a resistance to a high resistance level, in various embodiments, may include the single PMOS transistor M1 (FIG. 5), two PMOS transistors M1, M2 connected in parallel (FIG. 8), the single NMOS transistor N1 (FIG. 6), or two NMOS transistors N1, N2 connected in parallel (FIG. 9), the decoder controller 412, or the like, other logic hardware, and/or executable code stored on a computer readable medium. Other embodiments may include similar or equivalent means for setting a resistance to a high resistance level.

A means for changing a resistance to a low resistance level, in various embodiments, may include the single PMOS transistor M1 (FIG. 5), two PMOS transistors M1, M2 connected in parallel (FIG. 8), the single NMOS transistor N1 (FIG. 6), or two NMOS transistors N1, N2 connected in parallel (FIG. 9), the decoder controller 412, or the like, other logic hardware, and/or executable code stored on a computer readable medium. Other embodiments may include similar or equivalent means for setting a resistance to a high resistance level.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A circuit comprising:
a memory array comprising a plurality of memory cells;
a path configured to supply a voltage to bias a memory cell of the plurality of memory cells, wherein the path comprises:
a variable resistance circuit configured to:
set an associated resistance to a high resistance level in advance of the memory cell turning on; and
adjust the associated resistance from the high resistance level to a low resistance level in response to an end time of an initial turn-on time period.

2. The circuit of claim 1, wherein the variable resistance circuit comprises a transistor configured to:
receive an input voltage; and
set the associated resistance to the high resistance level in response to receipt of the input voltage.

3. The circuit of claim 2, wherein the transistor is configured to adjust the associated resistance from the high resistance level to the low resistance level in response to a change in voltage level of the input voltage.

4. The circuit of claim 2, wherein the transistor is configured to set the associated resistance to the high resistance level in response to receipt of the input voltage at an intermediate voltage level.

5. The circuit of claim 2, wherein the transistor is configured to set the associated resistance to the high resistance level in response to receipt of the input voltage at a minimum voltage level.

6. The circuit of claim 2, further comprising a word line decoder comprising the transistor.

7. The circuit of claim 2, further comprising a bit line decoder comprising the transistor.

8. The circuit of claim 1, wherein the path comprises a first path, the voltage comprises a first voltage, the variable resistance circuit comprises a first variable resistance circuit, the associated resistance comprises a first associated resistance, the high resistance level comprises a first high resistance level, the low resistance level comprise a first low resistance level, and wherein the circuit further comprises:
a second path configured to supply a second voltage to bias the memory cell, wherein the second path comprises:
a second variable resistance circuit configured to:
set a second associated resistance to a second high resistance level in advance of the memory cell turning on; and
adjust the second associated resistance from the second high resistance level to a second low resistance level in response to the end time of the initial turn-on time period.

9. The circuit of claim 1, wherein the variable resistance circuit is configured to set the associated resistance to the high resistance level prior to a word line select period of a read operation to read data from the memory cell.

10. The circuit of claim 1, wherein the variable resistance circuit comprises a pair of transistors connected in parallel, wherein one of the transistors of the pair is configured to turn off to set the associated resistance to the high resistance level, and wherein both transistors of the pair are configured to turn on to adjust the associated resistance from the high resistance level to the low resistance level.

11. A circuit comprising:
a memory array comprising a plurality of memory cells;
a voltage generator configured to generate a voltage during a read operation to read data from a memory cell of the plurality of memory cells;
a transistor circuit configured to:
receive the voltage; and
pass the voltage to a bias line coupled to the memory cell;
a bias circuit configured to:
bias the transistor circuit according to a first bias setting during a bias line set period prior to a turn-on time at which the memory cell conducts a spike portion of a memory cell current; and
switch to biasing the transistor circuit according to a second bias setting following the spike portion and before a sense result detection time of the sense operation.

12. The circuit of claim 11, wherein the transistor circuit comprises a p-channel metal-oxide-semiconductor field-effect transistor (PMOS transistor), and wherein the bias circuit is configured to switch to biasing the PMOS transistor according to the second bias setting by decreasing a gate voltage applied to the PMOS transistor from a first voltage level to a second voltage level.

13. The circuit of claim 12, wherein the first voltage level comprises an intermediate voltage level.

14. The circuit of claim 12, wherein the PMOS transistor comprises one of a plurality of transistors of a word line decoder.

15. The circuit of claim 11, wherein the transistor circuit comprises an n-channel metal-oxide-semiconductor field-effect transistor (NMOS transistor), and wherein the bias circuit is configured to switch to biasing the NMOS transistor according to the second bias setting by increasing a gate voltage applied to the NMOS transistor from a first voltage level to a second voltage level.

16. The circuit of claim 15, wherein the NMOS transistor comprises one of a plurality of transistors of a word line decoder.

17. A system comprising:
a memory array comprising a plurality of memory cells;
a word line coupled to a memory cell of the plurality of memory cells, the memory cell configured to conduct a spike portion of a memory cell current when the memory cell turns on during the sense operation;
a bit line coupled to the memory cell;
a word line decoder configured to set a word line voltage on the word line;
a bit line decoder configured to set a bit line voltage on the bit line; and
a decoder controller configured to:
prior to occurrence of the spike portion, set a first effective gate-to-source voltage of a first transistor circuit in the word line decoder and a second effective gate-to-source voltage of a second transistor circuit in the bit line decoder to reduced voltage levels, the reduced voltage levels configured to reduce a width of the spike portion; and after occurrence of a peak of the spike portion, increase the first effective gate-to-source voltage and the second effective gate-to-source voltage from the respective reduced voltage levels to respective increased voltage levels configured for a subsequent event associated with the memory cell.

18. The system of claim 17, wherein the decoder controller is configured to increase a gate voltage to increase the second effective gate-to-source voltage of the second transistor circuit.

19. The system of claim 17, wherein the decoder controller is configured to decrease a gate voltage to increase the first effective gate-to-source voltage of the first transistor circuit.

20. The system of claim 17, wherein the respective reduce voltage levels each correspond to an associated intermediate voltage level.

21. A method comprising:
supplying, with a path, a voltage to a bias line coupled to a memory cell;
biasing, with a decoder controller, a transistor of the path with a gate voltage at a first gate voltage level prior to the memory cell turning on; and
in response to identifying an end of an initial turn on time period, biasing, with the decoder controller, the transistor with the gate voltage at a second gate voltage level that increases a gate-to-source voltage of the transistor.

22. A circuit comprising:
means for supplying a voltage to bias a memory cell during a read operation to read data from the memory cell;
means for setting a resistance to a high resistance level prior to a turn-on time of the read operation; and
means for changing the resistance to a low resistance level in response to an end of an initial turn-on time period of the read operation.

* * * * *